(12) United States Patent
Liu et al.

(10) Patent No.: US 12,408,478 B2
(45) Date of Patent: Sep. 2, 2025

(54) METHOD FOR MANUFACTURING SILICON PHOTONIC DEVICE AND SILICON PHOTONIC DEVICE THEREOF

(71) Applicant: TAIWAN SEMICONDUCTOR MANUFACTURING COMPANY LTD., Hsinchu (TW)

(72) Inventors: Wei-Kang Liu, Taichung (TW); Chih-Tsung Shih, Hsinchu (TW); Hau-Yan Lu, Hsinchu (TW); Yingkit Felix Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 506 days.

(21) Appl. No.: 17/824,923

(22) Filed: May 26, 2022

(65) Prior Publication Data
US 2023/0387334 A1    Nov. 30, 2023

(51) Int. Cl.
| | | |
|---|---|---|
| *H10F 77/40* | (2025.01) | |
| *G02B 6/42* | (2006.01) | |
| *H10F 71/00* | (2025.01) | |
| *H10F 77/00* | (2025.01) | |

(52) U.S. Cl.
CPC ......... *H10F 77/413* (2025.01); *G02B 6/4214* (2013.01); *H10F 71/00* (2025.01); *H10F 77/953* (2025.01)

(58) Field of Classification Search
CPC ... G02B 6/12004; G02B 6/4214; H10F 71/00; H10F 77/413; H10F 77/953
See application file for complete search history.

(56) References Cited

U.S. PATENT DOCUMENTS

| | | | |
|---|---|---|---|
| 2014/0029894 A1* | 1/2014 | Bowen | G02B 6/34 385/37 |
| 2017/0207600 A1* | 7/2017 | Klamkin | H01S 5/142 |
| 2017/0307834 A1* | 10/2017 | Mathai | G02B 6/4214 |
| 2020/0006304 A1* | 1/2020 | Chang | H01L 23/48 |
| 2022/0043208 A1* | 2/2022 | Hsia | G02B 6/30 |

* cited by examiner

*Primary Examiner* — Marlon T Fletcher
*Assistant Examiner* — Christina A Sylvia
(74) *Attorney, Agent, or Firm* — WPAT LAW; Anthony King

(57) ABSTRACT

A method for manufacturing an integrated circuit device is provided. The method includes: providing a photonic structure including an insulating structure and an optical coupler embedded in the insulating structure; and removing a portion of the insulating structure to expose a coupling surface of the optical coupler and form a light reflective structure corresponding to the coupling surface.

20 Claims, 26 Drawing Sheets

METHOD FOR MANUFACTURING SILICON PHOTONIC DEVICE AND SILICON PHOTONIC DEVICE THEREOF

BACKGROUND

As for silicon photonic devices such as optical transceivers, vertical coupling can accomplish wafer-level testing. A grating coupler has been applied to perform the vertical coupling. However, the wavelength selectivity of the grating coupler significantly limits its bandwidth, causing it difficult to achieve broadband testing.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
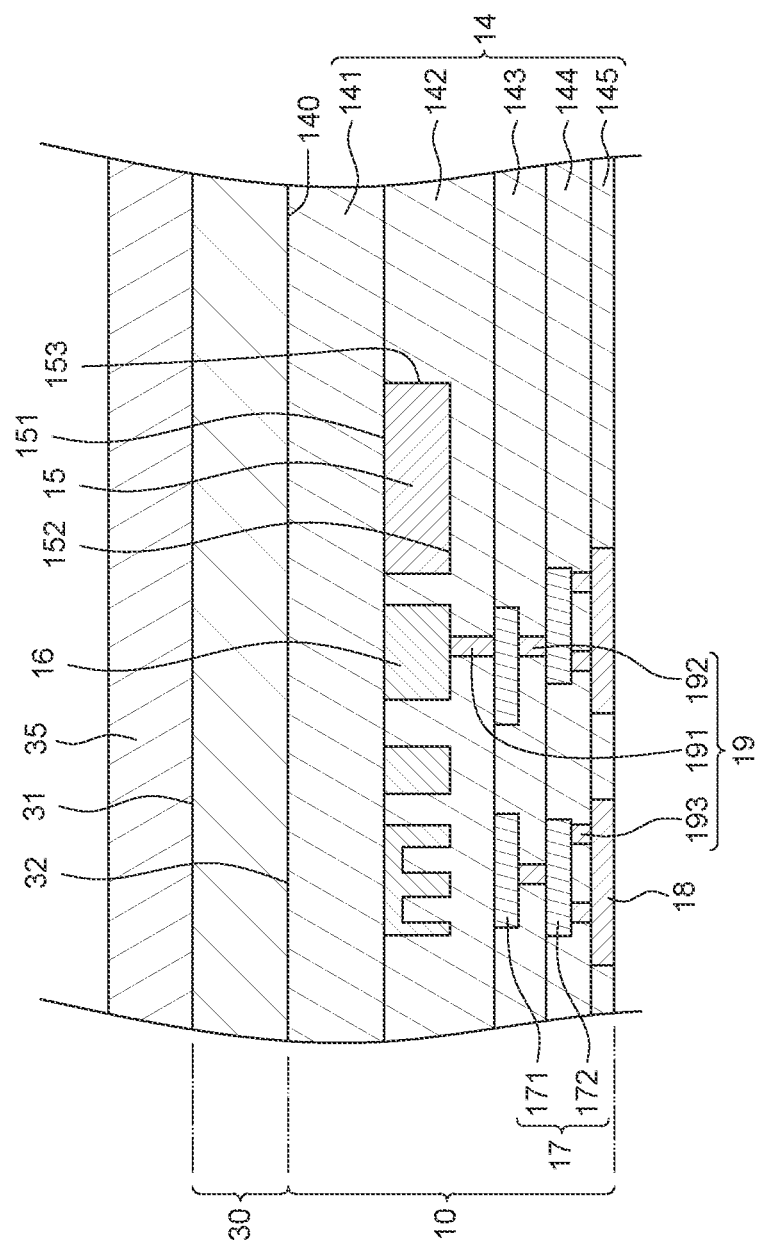
FIG. 1 illustrates a cross-sectional view of one or more stages of an example of a method for manufacturing an integrated circuit device according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 through FIG. 10 illustrate a method for manufacturing an integrated circuit device 1 according to some embodiments of the present disclosure. In some embodiments, the integrated circuit device 1 can be a high-speed transceiver.

Referring to FIG. 1, a photonic structure 10 is provided. The photonic structure 10 can be formed on a substrate 30. The substrate 30 has a first surface 31 (e.g., a top surface) and a second surface 32 (e.g., a bottom surface) opposite to the first surface 31. The photonic structure 10 can be formed on the second surface 32 of the substrate 30. In some embodiments, the substrate 30 can include an oxide structure 35 covering the first surface 31.

The photonic structure 10 can also be referred to as "photonic die" or "P-die." As shown in FIG. 1, the photonic structure 10 includes an insulating structure 14, an optical coupler 15, a photodetector 16, at least one circuit layer 17 in contact with the insulating structure 14, a plurality of bonding pads 18 and a plurality of inner conductive vias 19.

In some embodiments, as shown in FIG. 1, the insulating structure 14 can have a top surface 140 and include a plurality of insulating layers (including, for example, a first insulating layer 141, a second insulating layer 142, a third insulating layer 143, a fourth insulating layer 144 and a fifth insulating layer 145). The top surface 140 is substantially coplanar with the second surface 32 of the substrate 30. The insulating layers (e.g., the first insulating layer 141, the second insulating layer 142, the third insulating layer 143, the fourth insulating layer 144 and the fifth insulating layer 145) are stacked on one another. For example, the first insulating layer 141 can be the topmost insulating layer and formed on the second surface 32 of the substrate 30. A material of the insulating layers (e.g., the first insulating layer 141, the second insulating layer 142, the third insulating layer 143, the fourth insulating layer 144 and the fifth insulating layer 145) can be, for example, buried oxide.

The optical coupler 15 can be, for example, a waveguide coupler. The optical coupler 15 is embedded in the insulating structure 14. That is, the optical coupler 15 is in contact with the insulating structure 14. As shown in FIG. 1, the optical coupler 15 is embedded in the second insulating layer 142 and on a bottom surface of the first insulating layer 141. The optical coupler 15 is configured to receive a light signal. In some embodiments, the optical coupler 15 can have a top surface 151, a bottom surface 152 opposite to the top surface 151 and a coupling surface 153 (or an edge) extending between the top surface 151 and the bottom surface 152.

The photodetector 16 is embedded in the insulating structure 14 and spaced apart from the optical coupler 15. As shown in FIG. 1, the photodetector 16 is embedded in the second insulating layer 142 and on the bottom surface of the first insulating layer 141. The photodetector 16 is configured to convert the light signal into an electric signal.

The at least one circuit layer 17 can include a first circuit layer 171 and a second circuit layer 172. The first circuit layer 171 is formed on a bottom surface of the second insulating layer 142 and covered by the third insulating layer 143. The second circuit layer 172 is formed on a bottom surface of the third insulating layer 143 and covered by the fourth insulating layer 144. A material of the circuit layer 17 (including, for example, the first circuit layer 171 and the second circuit layer 172) can include, for example, copper, another conductive metal, or an alloy thereof.

The bonding pads 18 are formed on a bottom surface of the fourth insulating layer 144 and exposed from a bottom surface of the fifth insulating layer 145. The inner conductive vias 19 can include at least one first inner conductive via 191, at least one second inner conductive via 192 and at least one third inner conductive via 193. The first inner conductive via 191 extends through the second insulating layer 142 and is disposed between the photodetector 16 and the first circuit layer 171 for electrically connecting the photodetector 16 and the first circuit layer 171. In some embodiments, the first inner conductive via 191 and the first circuit layer 171 can be formed concurrently and integrally. The second inner conductive via 192 extends through the third insulating layer 143 and is disposed between the first circuit layer 171 and the second circuit layer 172 for electrically connecting the first circuit layer 171 and the second circuit layer 172. In some embodiments, the second inner conductive via 192 and the second circuit layer 172 can be formed concurrently and integrally. The third inner conductive via 193 extends through the fourth insulating layer 144 and is disposed between the second circuit layer 172 and the bonding pads 18 for electrically connecting the second circuit layer 172 and the bonding pads 18. In some embodiments, the third inner conductive via 193 and the bonding pads 18 can be formed concurrently and integrally.

Figure 2:
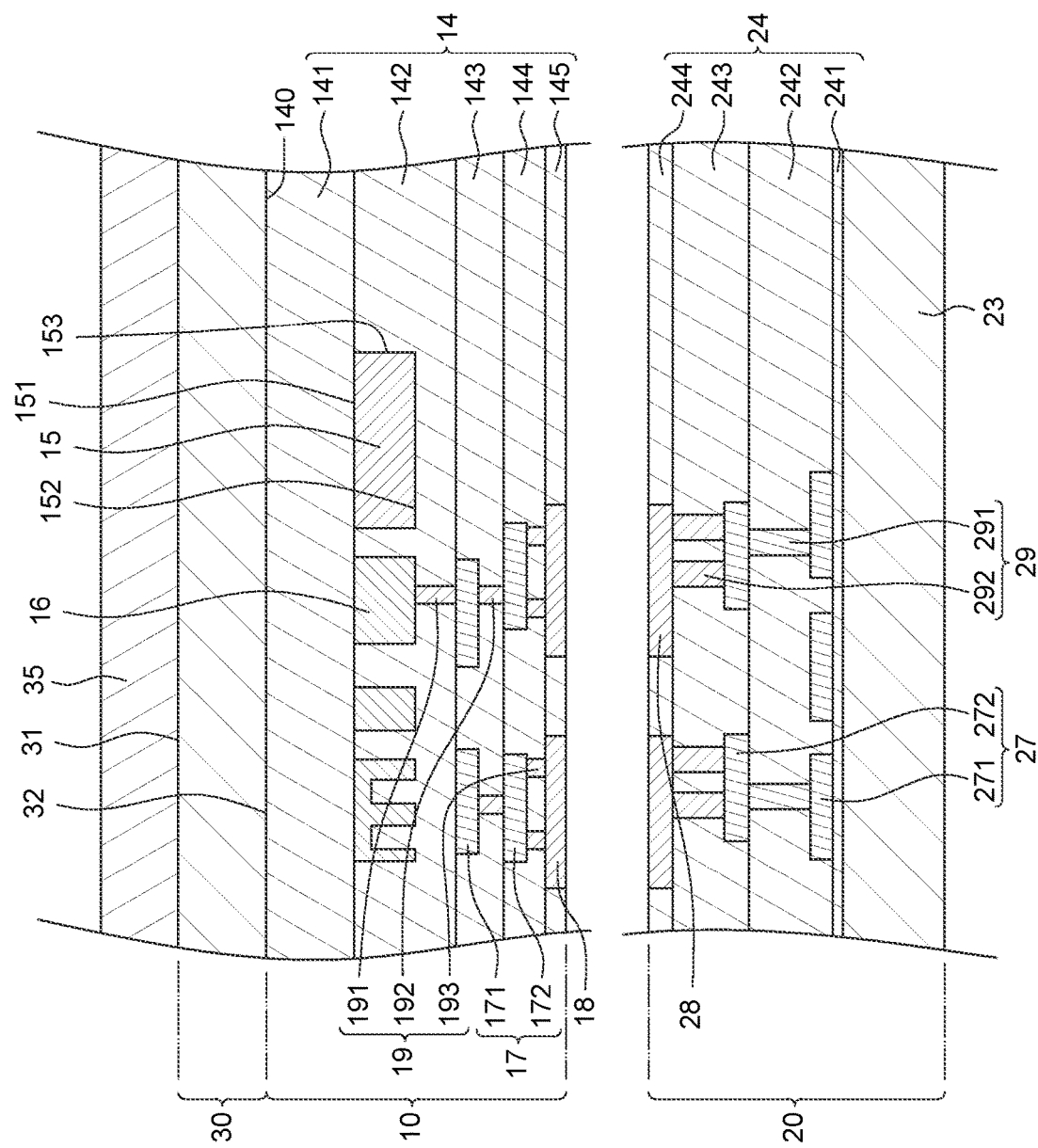
FIG. 2 illustrates a cross-sectional view of one or more stages of an example of a method for manufacturing an integrated circuit device according to some embodiments of the present disclosure.
Figure 3:
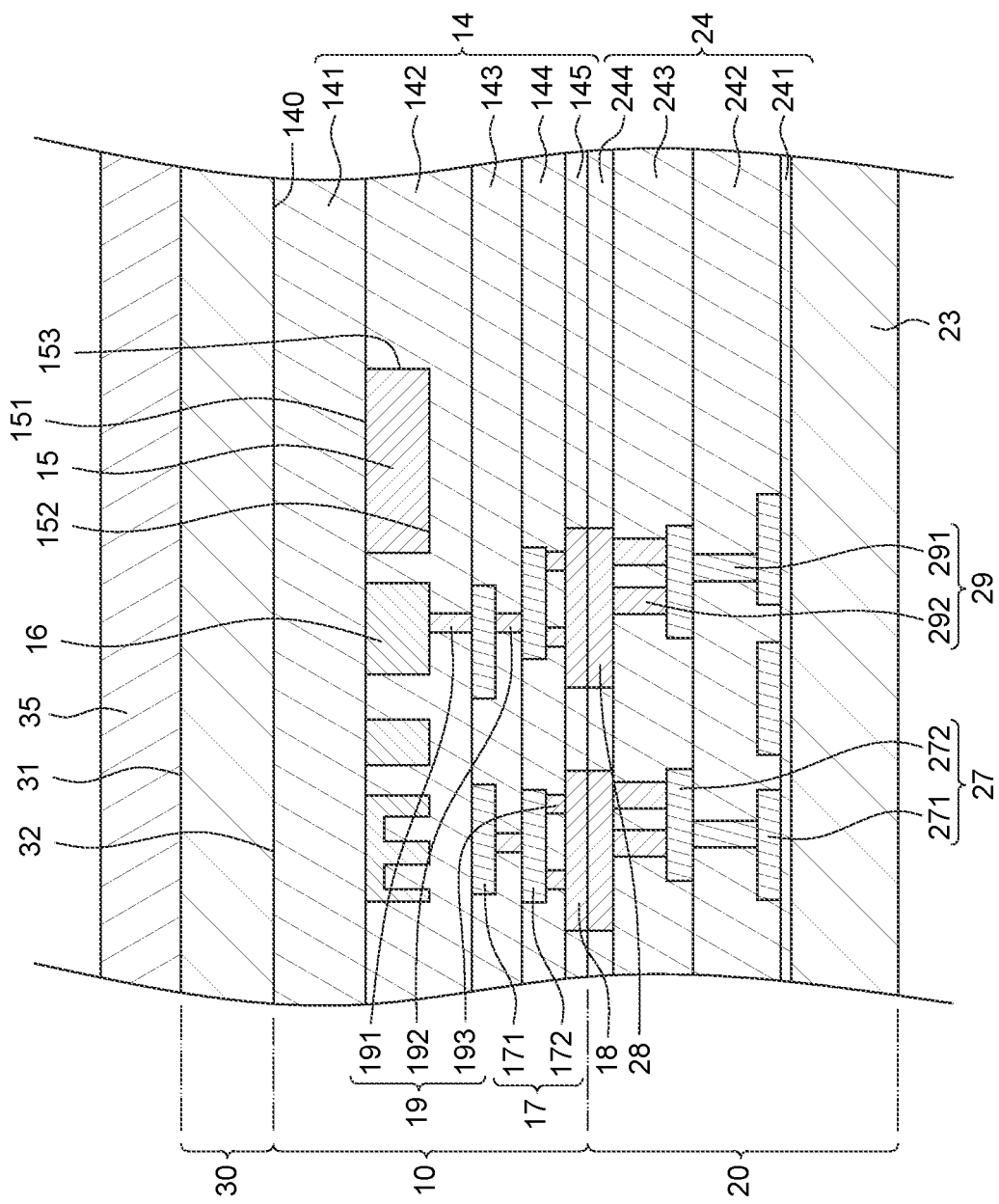
FIG. 3 illustrates a cross-sectional view of one or more stages of an example of a method for manufacturing an integrated circuit device according to some embodiments of the present disclosure.

Referring to FIG. 2 and FIG. 3, an electronic structure 20 is provided, and the photonic structure 10 and the electronic structure 20 are bonded together. The electronic structure 20 can also be referred to as "electronic die" or "E-die." As shown in FIG. 2, the electronic structure 20 includes a substrate 23, an insulating structure 24, at least one circuit layer 27 in contact with the insulating structure 24, a plurality of bonding pads 28 and a plurality of inner conductive vias 29. The substrate 23 can be, for example, a logic substrate.

In some embodiments, as shown in FIG. 2, the insulating structure 24 can include a plurality of insulating layers (including, for example, a first insulating layer 241, a second insulating layer 242, a third insulating layer 243 and a fourth insulating layer 244). The insulating layers (e.g., the first insulating layer 241, the second insulating layer 242, the third insulating layer 243 and the fourth insulating layer 244) are stacked on one another. For example, the first insulating layer 241 can be the bottommost insulating layer and formed on a top surface of the substrate 23. A material of the insulating layers (e.g., the first insulating layer 241, the second insulating layer 242, the third insulating layer 243 and the fourth insulating layer 244) can be, for example, buried oxide.

The at least one circuit layer 27 can include a first circuit layer 271 and a second circuit layer 272. The first circuit layer 271 is formed on a top surface of the first insulating layer 241 and covered by the second insulating layer 242. The second circuit layer 272 is formed on a top surface of the second insulating layer 242 and covered by the third insulating layer 243. A material of the circuit layer 27 (including, for example, the first circuit layer 271 and the second circuit layer 272) can include, for example, copper, another conductive metal, or an alloy thereof.

The bonding pads 28 are formed on a top surface of the third insulating layer 243 and exposed from a top surface of the fourth insulating layer 244. The inner conductive vias 29 can include at least one first inner conductive via 291 and at least one second inner conductive via 292. The first inner conductive via 291 extends through the second insulating layer 242 and is disposed between the first circuit layer 271 and the second circuit layer 272 for electrically connecting the first circuit layer 271 and the second circuit layer 272. In some embodiments, the first inner conductive via 291 and the second circuit layer 272 can be formed concurrently and integrally. The second inner conductive via 292 extends through the third insulating layer 243 and is disposed between the second circuit layer 272 and the bonding pads 28 for electrically connecting the second circuit layer 272 and the bonding pads 28. In some embodiments, the second inner conductive via 292 and the bonding pads 28 can be formed concurrently and integrally. As shown in FIG. 3, the bonding pads 18 of the photonic structure 10 and the bonding pads 28 of the electronic structure 20 are bonded together.

Figure 4:
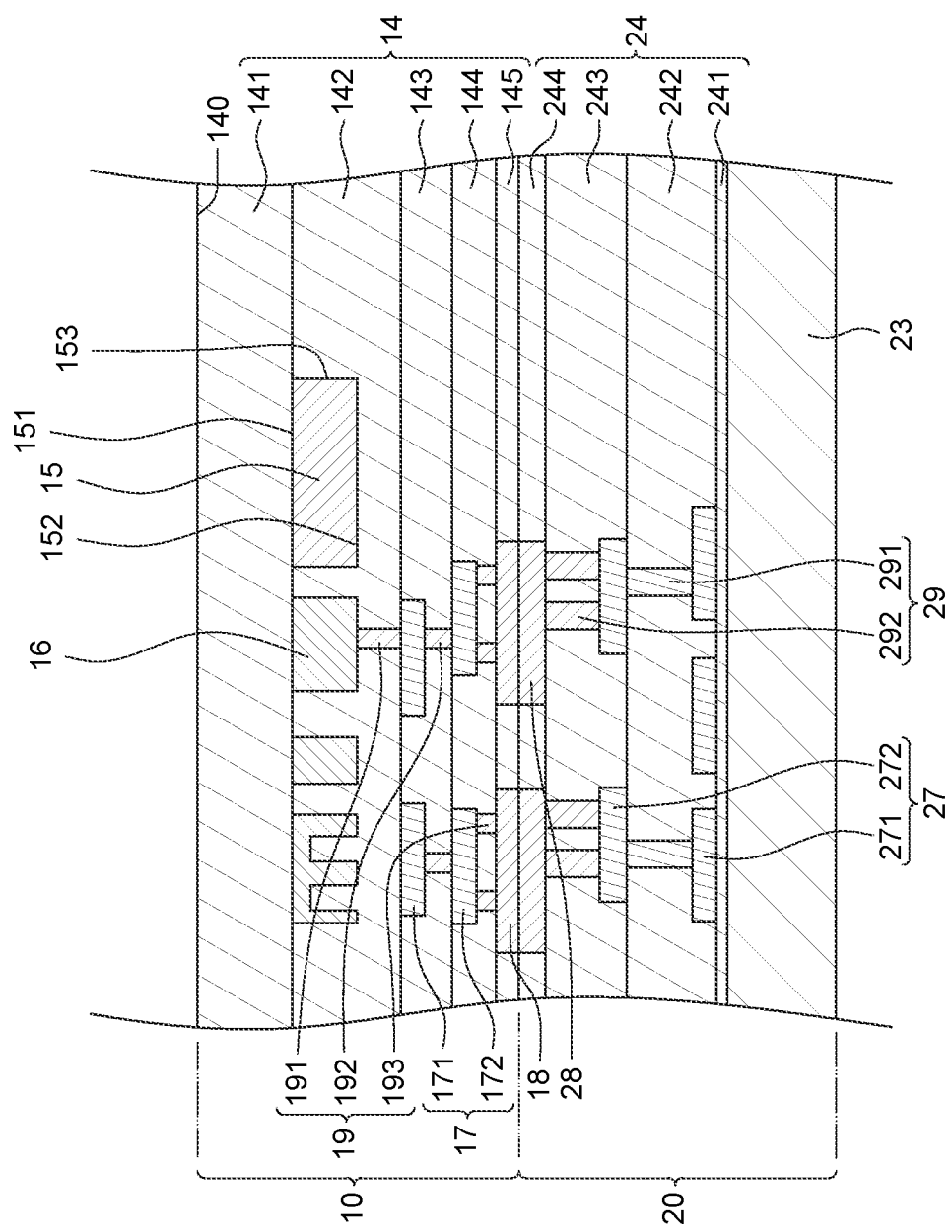
FIG. 4 illustrates a cross-sectional view of one or more stages of an example of a method for manufacturing an integrated circuit device according to some embodiments of the present disclosure.

Referring to FIG. 4, the substrate 30 is removed to expose the insulating structure 14 (including, for example, the first insulating layer 141, the second insulating layer 142, the third insulating layer 143, the fourth insulating layer 144 and the fifth insulating layer 145).

Figure 5:
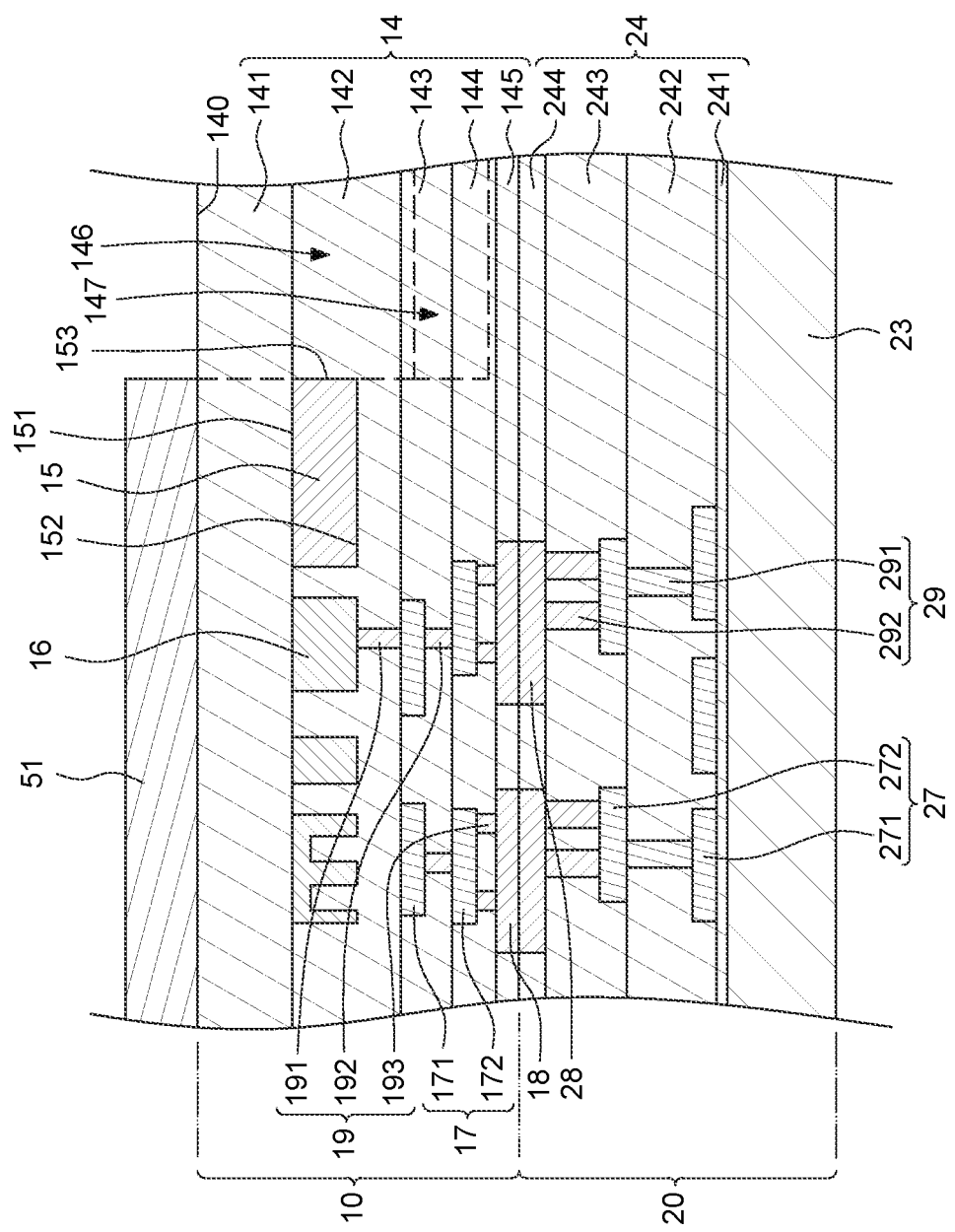
FIG. 5 illustrates a cross-sectional view of one or more stages of an example of a method for manufacturing an integrated circuit device according to some embodiments of the present disclosure.

Referring to FIG. 5, a first photoresist layer 51 is formed on the top surface 140 (e.g., a top surface of the first insulating layer 141) of the insulating structure 14 to cover a portion of the top surface 140 by, for example, coating. In some embodiments, as shown in FIG. 5, the insulating structure 14 can define a first portion 146 and a second portion 147 below the first portion 146. The first photoresist layer 51 can expose the first portion 146 of the insulating structure 14.

Figure 6:
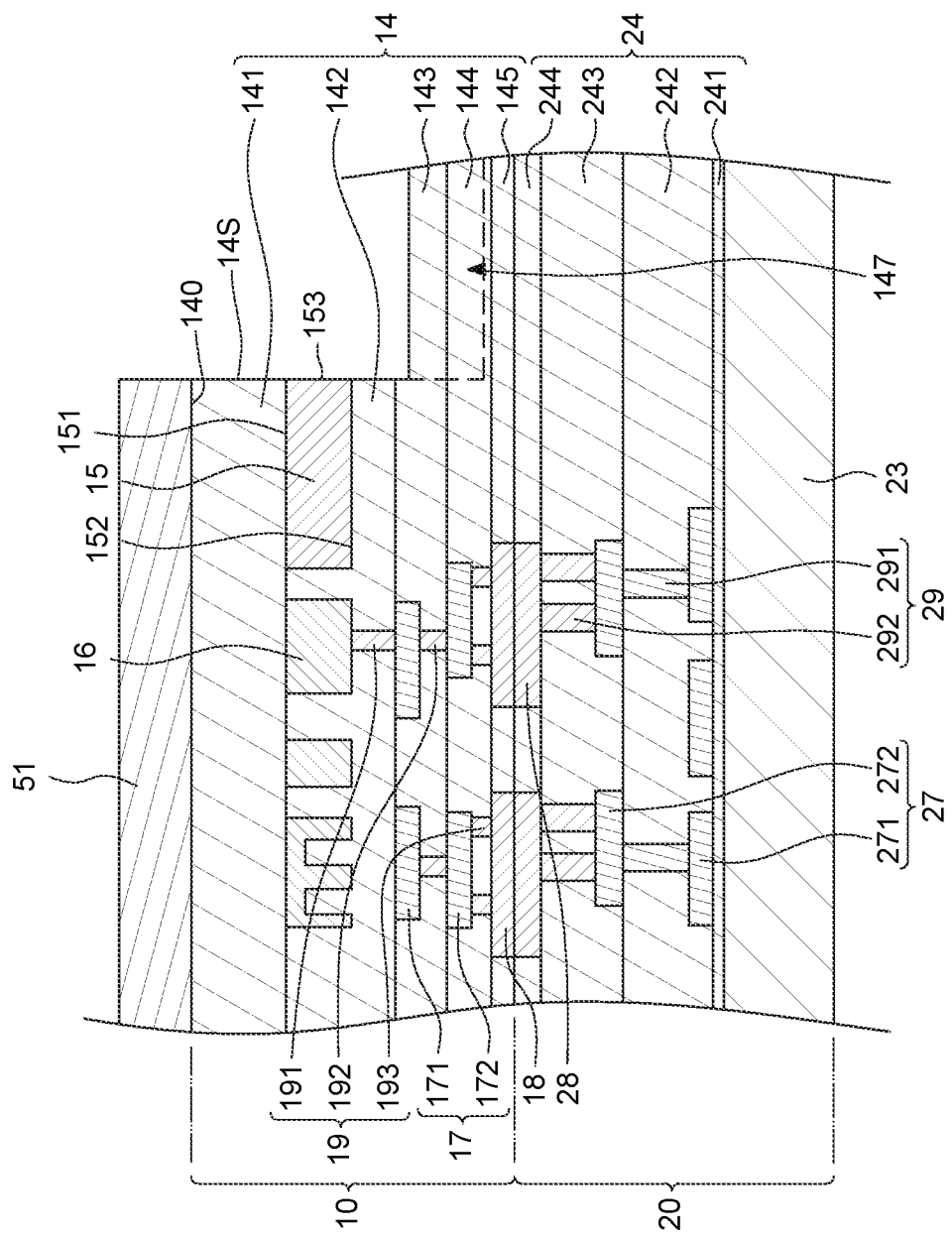
FIG. 6 illustrates a cross-sectional view of one or more stages of an example of a method for manufacturing an integrated circuit device according to some embodiments of the present disclosure.

Referring to FIG. 6, the first portion 146 of the insulating structure 14 is removed to expose the coupling surface 153 (or the edge) of the optical coupler 15 and the second portion 147 of the insulating structure 14 by, for example, etching. In some embodiments, the optical coupler 15 can also be referred to as "edge coupler." As shown in FIG. 6, the coupling surface 153 (or the edge) is exposed from and substantially coplanar with a lateral surface 14S of the insulating structure 14.

Figure 7:
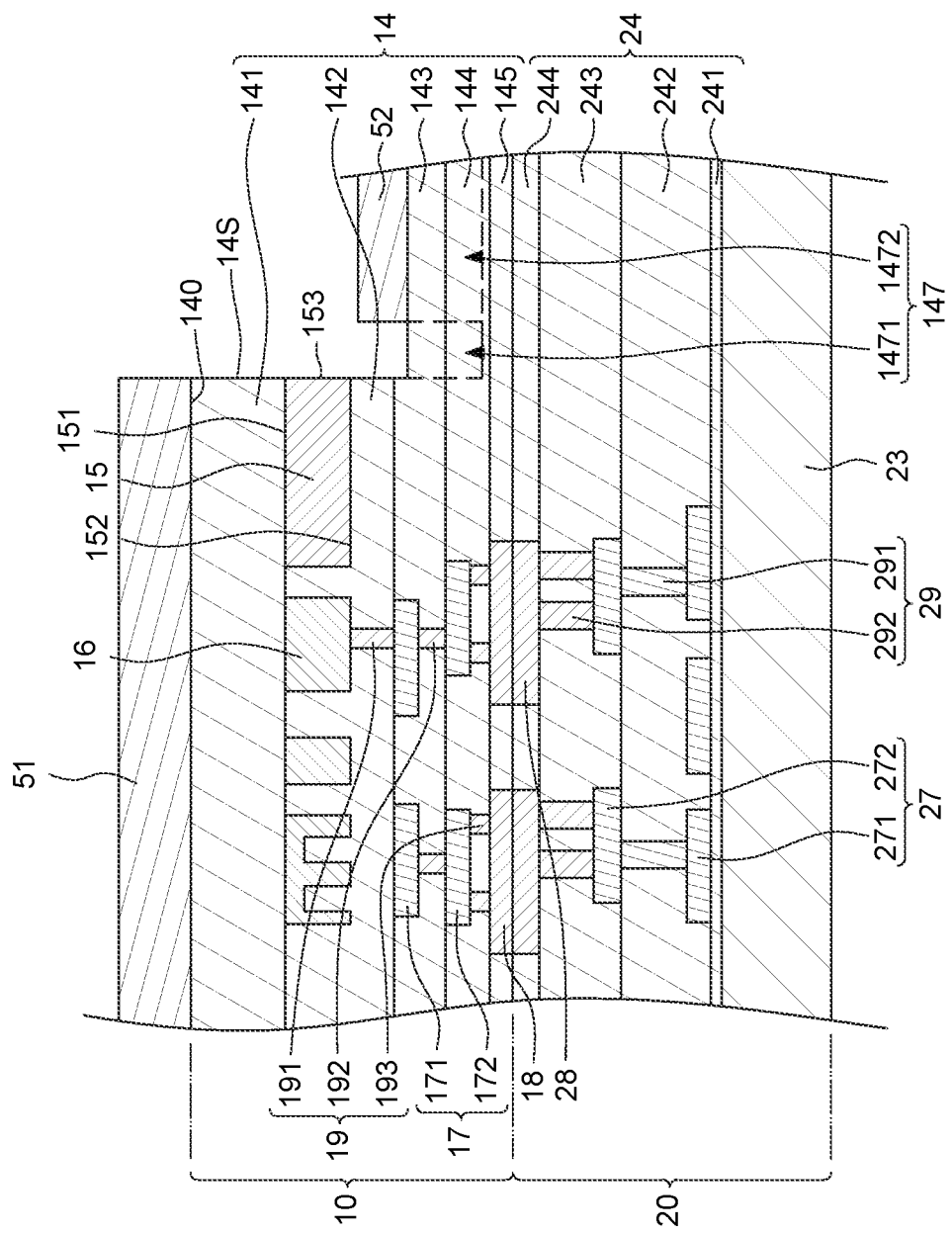
FIG. 7 illustrates a cross-sectional view of one or more stages of an example of a method for manufacturing an integrated circuit device according to some embodiments of the present disclosure.

Referring to FIG. 7, a second photoresist layer 52 is formed on a top surface of the second portion 147 of the insulating structure 14 to cover a portion of the top surface of the second portion 147 by, for example, coating. In some embodiments, as shown in FIG. 7, the second portion 147 can define an inner portion 1471 and an outer portion 1472 opposite to the inner portion 1471. The second photoresist layer 52 can cover the outer portion 1472 and expose the inner portion 1471.

Figure 8:
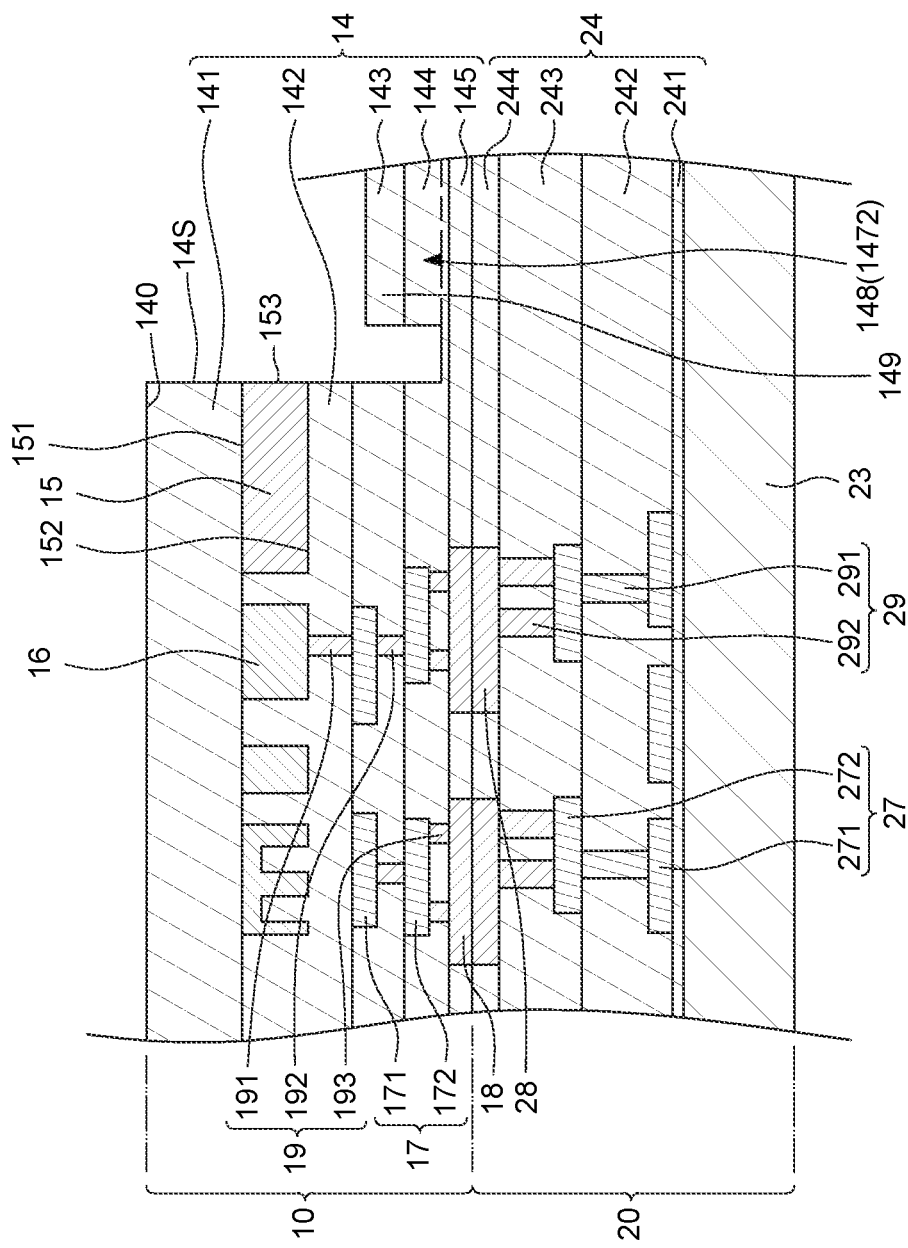
FIG. 8 illustrates a cross-sectional view of one or more stages of an example of a method for manufacturing an integrated circuit device according to some embodiments of the present disclosure.

Referring to FIG. 8, the inner portion 1471 of the second portion 147 is removed to form a rib portion 148 (i.e., the outer portion 1472) on the insulating structure 14 by, for example, etching. Then, the first photoresist layer 51 and the second photoresist layer 52 are removed. As shown in FIG. 8, the rib portion 148 has a corner portion 149.

Figure 9:
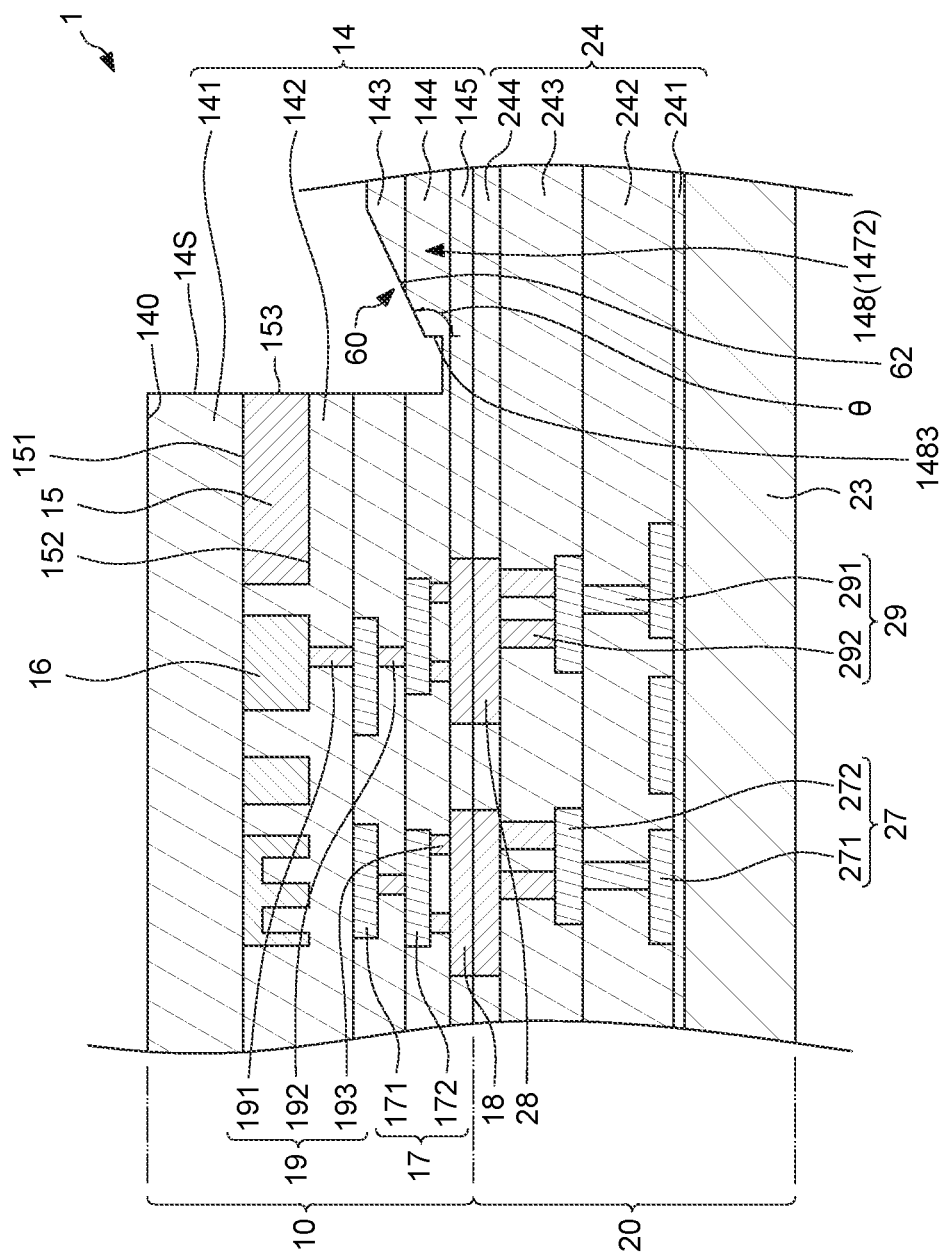
FIG. 9 illustrates a cross-sectional view of one or more stages of an example of a method for manufacturing an integrated circuit device according to some embodiments of the present disclosure.

Referring to FIG. 9, the rib portion 148 is shaped to form a light reflective structure 60 by, for example, plasma hitting. The light reflective structure 60 corresponds to the coupling surface 153 of the optical coupler 15. In some embodiments, the light reflective structure 60 can include an inclined reflective surface 62. The plasma can hit the corner portion 149 of the rib portion 148 to form the inclined reflective surface 62 on the rib portion 148. In some embodiments, an angle θ between the inclined reflective surface 62 and a lateral surface 1483 of the rib portion 148 can be greater than or equal to 90 degrees. The inclined reflective surface 62 can be a mirror-like surface. In some embodiments, as shown in FIG. 9, the inclined reflective surface 62 can be lower than the optical coupler 15. In some embodiments, the inclined reflective surface 62 can be lower than the top surface 151 of the optical coupler 15. In some embodiments, the inclined reflective surface 62 can be lower than the bottom surface 152 of the optical coupler 15.

As shown in FIG. 9, the photonic structure 10, the electronic structure 20 and the light reflective structure 60 (including, for example, the inclined reflective surface 62) can constitute an integrated circuit device 1.

Figure 10:
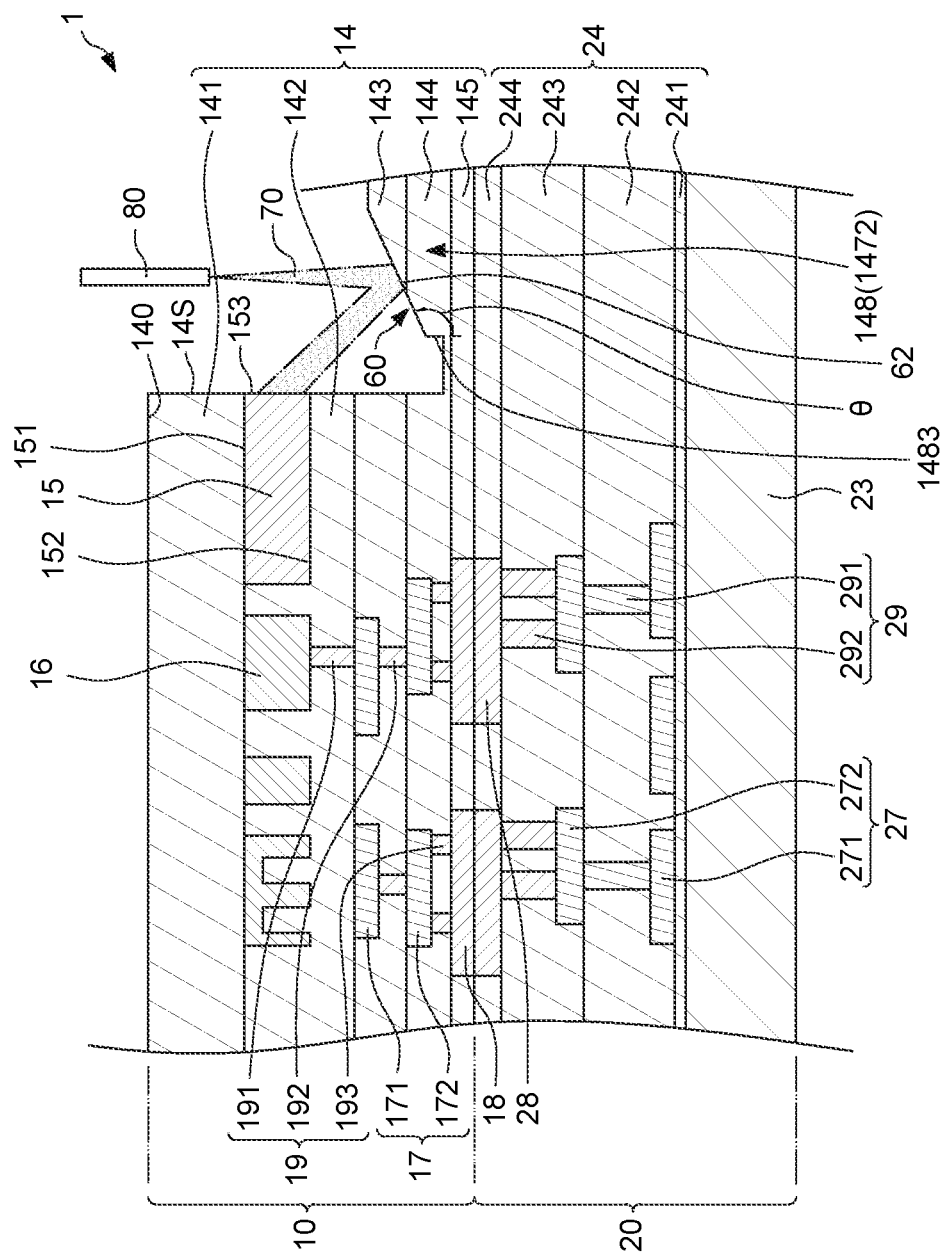
FIG. 10 illustrates a cross-sectional view of one or more stages of an example of a method for manufacturing an integrated circuit device according to some embodiments of the present disclosure.

Referring to FIG. 10, a light testing signal 70 from an optical fiber 80 is coupled into the coupling surface 153 of the optical coupler 15 through the light reflective structure 60 (including, for example, the inclined reflective surface 62). Then, the light testing signal 70 is coupled to the photodetector 16 from one end of the optical coupler 15. The photodetector 16 can convert the light testing signal 70 into an electric testing signal, and output the electric testing signal to the electronic structure 20 to complete the test.

The method of the present disclosure can be applied in an integrated circuit device including the photonic structure 10 as illustrated above; however, the disclosure is not limited thereto. As shown in the embodiments illustrated in FIG. 1 through FIG. 10, the light reflective structure 60 (including, for example, the inclined reflective surface 62) is directly formed on the photonic structure 10. An optical path of the light testing signal 70 can be changed from vertical coupling to edge coupling through the light reflective structure 60 (including, for example, the inclined reflective surface 62). Additionally, the optical coupler 15 can be used as the edge coupler, and the light reflective structure 60 (including, for example, the inclined reflective surface 62) can increase the bandwidth of the edge coupler (i.e., the optical coupler 15) to achieve broadband testing.

Figure 11:
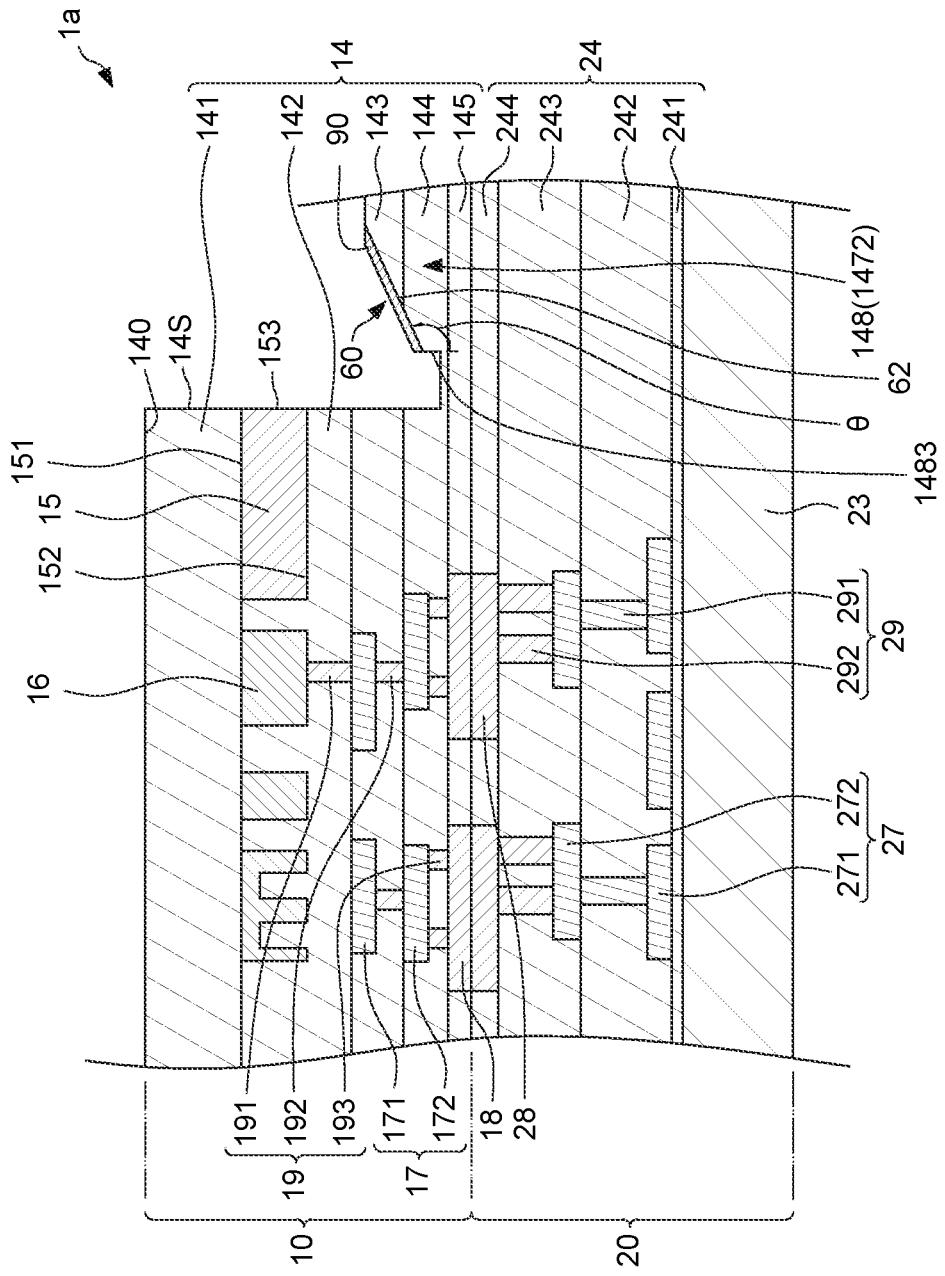
FIG. 11 illustrates a cross-sectional view of one or more stages of an example of a method for manufacturing an integrated circuit device according to some embodiments of the present disclosure.

FIG. 11 illustrates a method for manufacturing an integrated circuit device 1a according to some embodiments of the present disclosure. The initial stages of the illustrated process are the same as, or similar to, the stages illustrated in FIG. 1 through FIG. 9. FIG. 11 depicts a stage subsequent to that depicted in FIG. 9.

Referring to FIG. 11, a light reflective film 90 is formed or disposed on the inclined reflective surface 62. A material of the light reflective film 90 can include metal, metal oxide, or metal nitride. The metal can be, for example, aluminum (Al), gold (Au), copper (Cu), or tantalum (Ta). The metal oxide can be, for example, titanium dioxide ($TiO_2$). The metal nitride can be, for example, Tantalum nitride (TaN). In some embodiments, the light reflective film 90 can be a distributed Bragg reflector (DBR) film.

Figure 12:
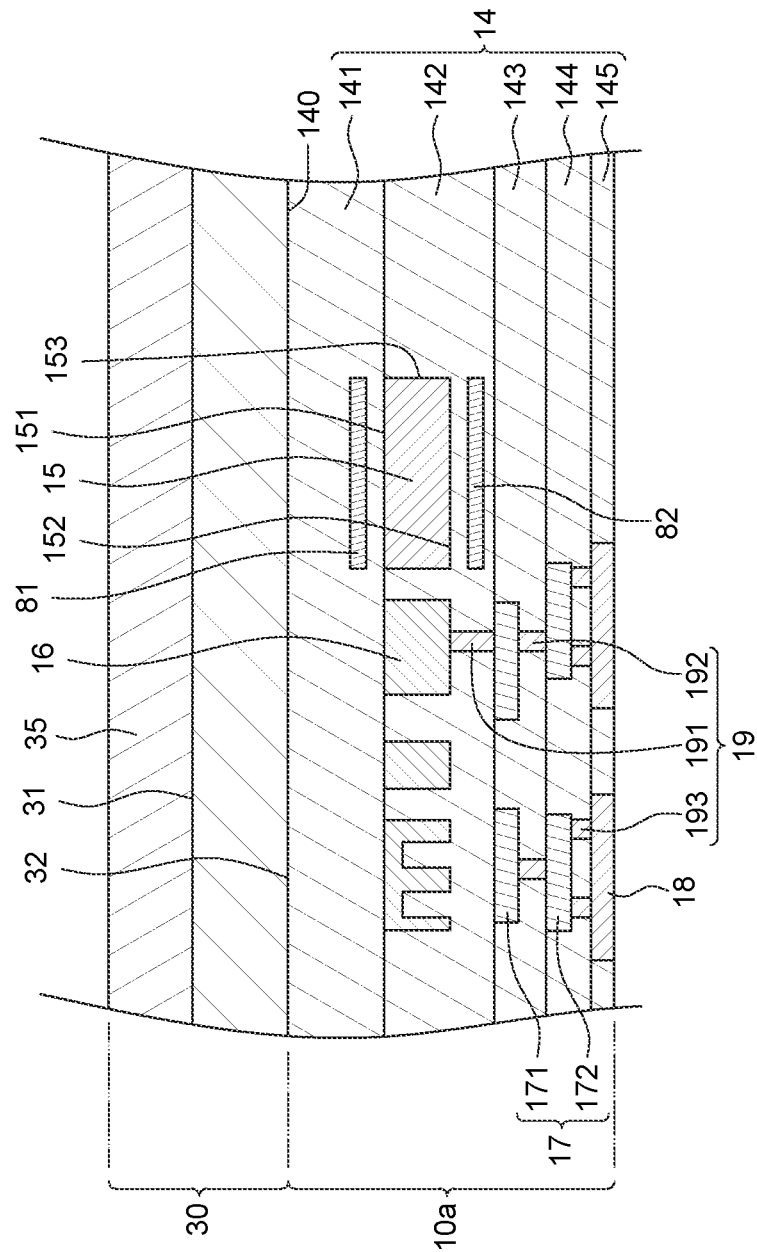
FIG. 12 illustrates a cross-sectional view of one or more stages of an example of a method for manufacturing an integrated circuit device according to some embodiments of the present disclosure.

FIG. 12 illustrates a cross-sectional view of one or more stages of an example of a method for manufacturing an integrated circuit device according to some embodiments of the present disclosure. The stage illustrated in FIG. 12 is the same as, or similar to, the stage illustrated in FIG. 1, except for a structure of the photonic structure 10a. In some embodiments, as shown in FIG. 12, an upper light reflector 81 can be formed in the insulating structure 14 (e.g., the first insulating layer 141) and above the optical coupler 15, and a lower light reflector 82 can be formed in the insulating structure 14 (e.g., the second insulating layer 142) and below the optical coupler 15. The upper light reflector 81 is configured to guide the light signal leaking from the top surface 151 of the optical coupler 15 back into the optical coupler 15, and the lower light reflector 82 is configured to guide the light signal leaking from the bottom surface 152 of the optical coupler 15 back into the optical coupler 15, lead to increased light coupling efficiency.

Figure 13:
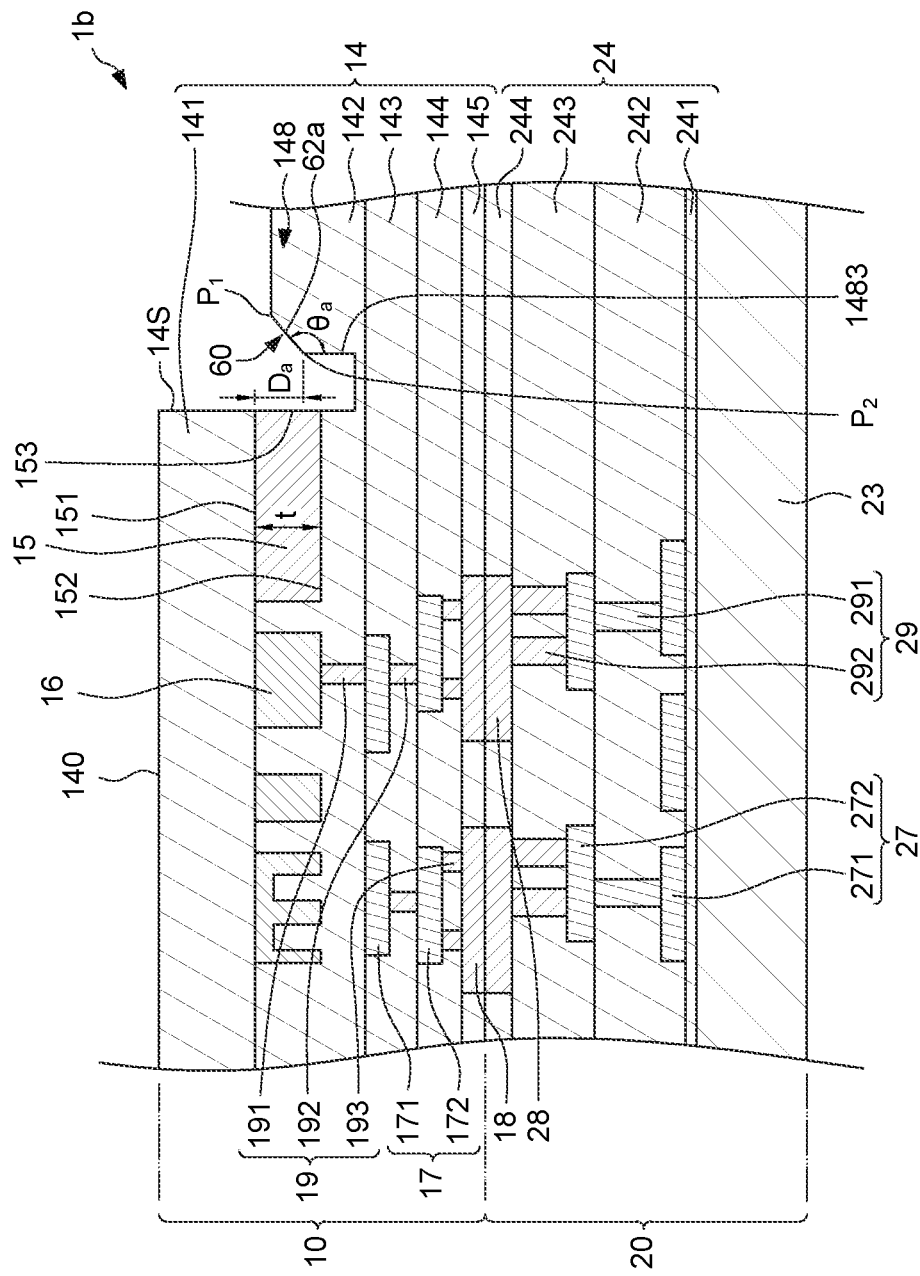
FIG. 13 illustrates a cross-sectional view of one or more stages of an example of a method for manufacturing an integrated circuit device according to some embodiments of the present disclosure.

FIG. 13 illustrates a cross-sectional view of one or more stages of an example of a method for manufacturing an integrated circuit device 1b according to some embodiments of the present disclosure. The stage illustrated in FIG. 13 is the same as, or similar to, the stage illustrated in FIG. 9, except for a configuration of the inclined reflective surface 62a. In some embodiments, as shown in FIG. 13, an angle $\theta_a$ between the inclined reflective surface 62a and the lateral surface 1483 of the rib portion 148 can be different from the angle $\theta$ of FIG. 9. The inclined reflective surface 62a can have a highest point $P_1$ and a lowest point $P_2$. As shown in FIG. 13, an elevation of the highest point $P_1$ can be lower than an elevation of the top surface 151 of the optical coupler 15. An elevation of the lowest point $P_2$ can be higher than an elevation of the bottom surface 152 of the optical coupler 15. In addition, a vertical distance Da between the elevation of the top surface 151 of the optical coupler 15 and the elevation of the lowest point $P_2$ can be less than a thickness t of the optical coupler 15. In some embodiments, an incident angle of the light testing signal 70 (FIG. 10) can be adjusted based on the angle $\theta_a$.

Figure 14:
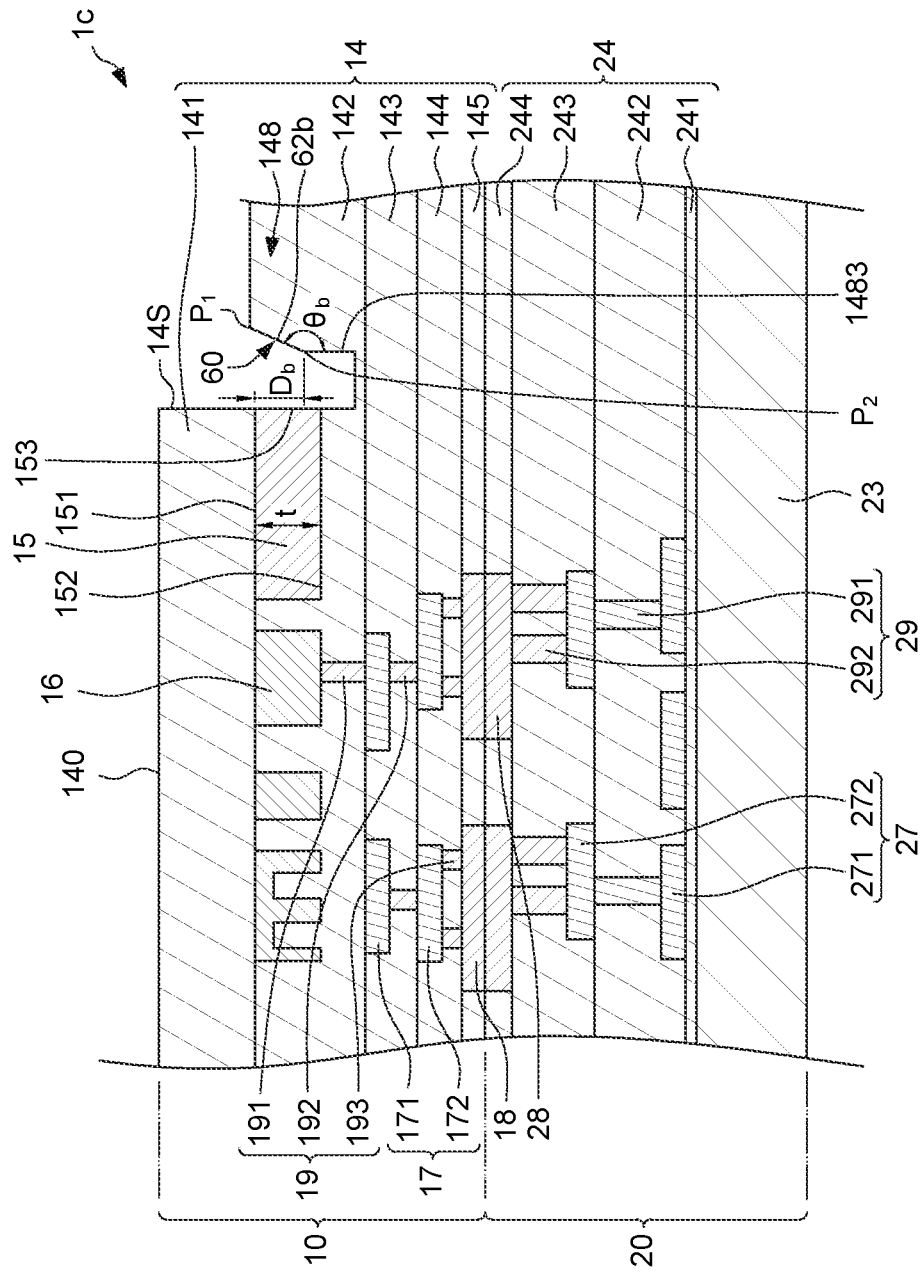
FIG. 14 illustrates a cross-sectional view of one or more stages of an example of a method for manufacturing an integrated circuit device according to some embodiments of the present disclosure.

FIG. 14 illustrates a cross-sectional view of one or more stages of an example of a method for manufacturing an integrated circuit device 1c according to some embodiments of the present disclosure. The stage illustrated in FIG. 14 is the same as, or similar to, the stage illustrated in FIG. 13, except for a configuration of the inclined reflective surface 62b. In some embodiments, as shown in FIG. 14, an angle $\theta_b$ between the inclined reflective surface 62b and the lateral surface 1483 of the rib portion 148 can be different from the angle $\theta_a$ of FIG. 13. The elevation of the highest point $P_1$ can be higher than the elevation of the top surface 151 of the optical coupler 15. In addition, a vertical distance Db between the elevation of the top surface 151 of the optical coupler 15 and the elevation of the lowest point $P_2$ can be less than the thickness t of the optical coupler 15. In some embodiments, the incident angle of the light testing signal 70 (FIG. 10) can be adjusted based on the angle $\theta_b$.

Figure 15:
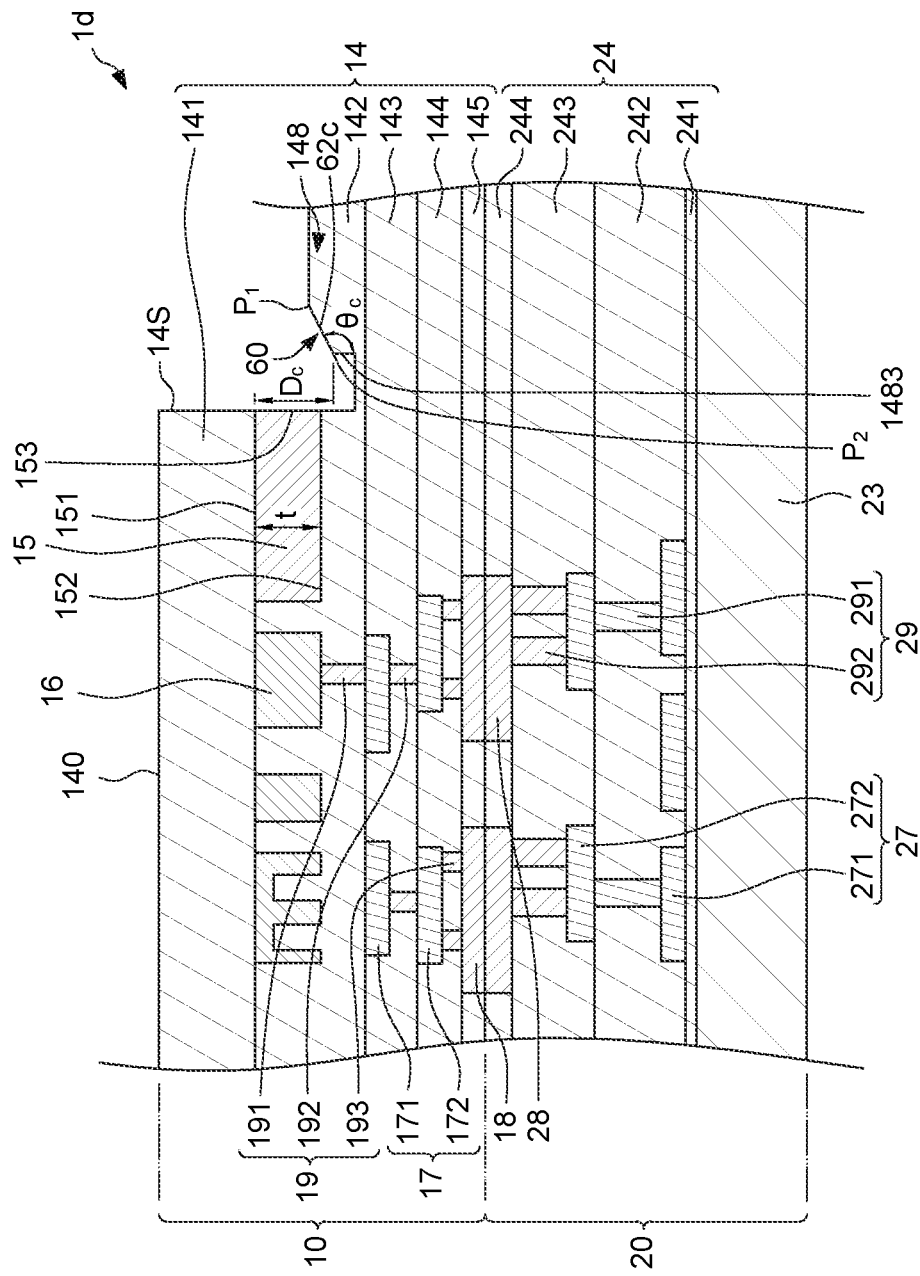
FIG. 15 illustrates a cross-sectional view of one or more stages of an example of a method for manufacturing an integrated circuit device according to some embodiments of the present disclosure.

FIG. 15 illustrates a cross-sectional view of one or more stages of an example of a method for manufacturing an integrated circuit device 1d according to some embodiments of the present disclosure. The stage illustrated in FIG. 15 is the same as, or similar to, the stage illustrated in FIG. 13, except for a configuration of the inclined reflective surface 62c. In some embodiments, as shown in FIG. 15, an angle $\theta_c$ between the inclined reflective surface 62c and the lateral surface 1483 of the rib portion 148 can be different from the angle $\theta_a$ of FIG. 13. The elevation of the lowest point $P_2$ can be lower than the elevation of the bottom surface 152 of the optical coupler 15. In addition, a vertical distance De between the elevation of the top surface 151 of the optical coupler 15 and the elevation of the lowest point $P_2$ can be greater than the thickness t of the optical coupler 15. In some embodiments, the incident angle of the light testing signal 70 (FIG. 10) can be adjusted based on the angle $\theta_c$.

Figure 16:
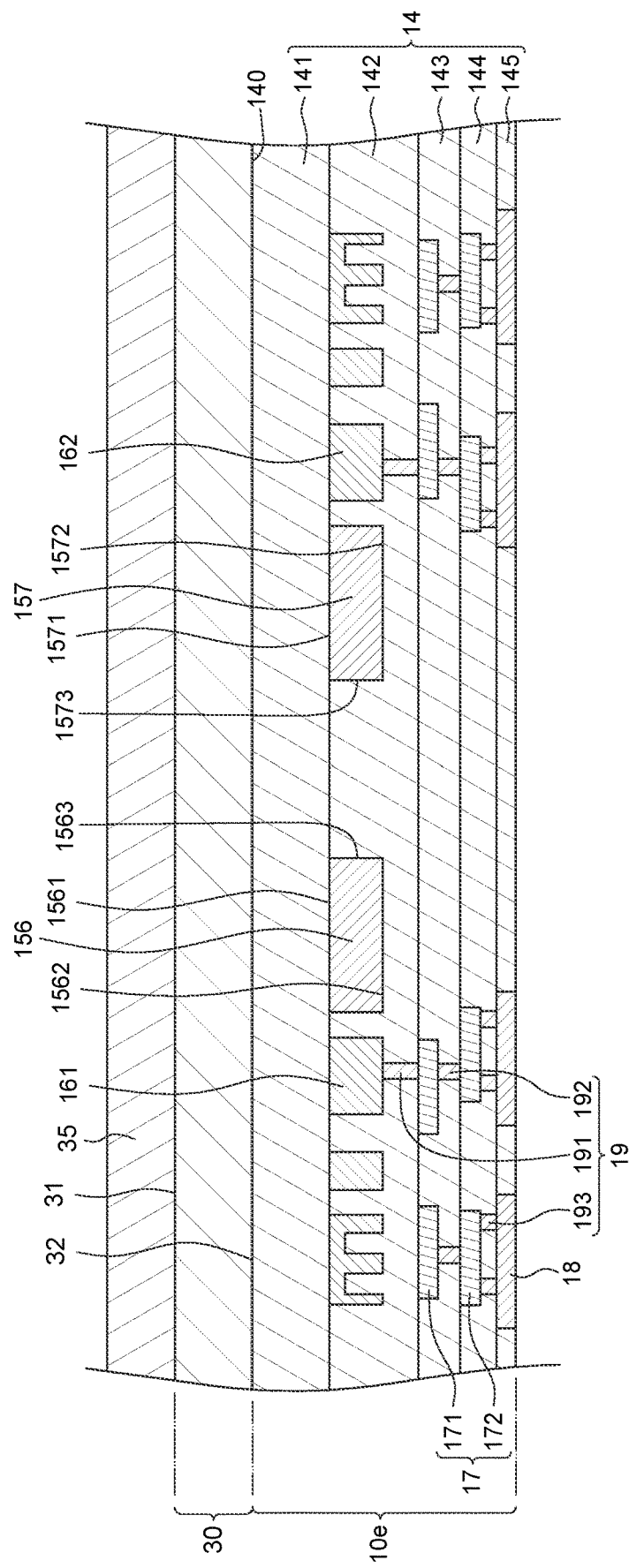
FIG. 16 illustrates a cross-sectional view of one or more stages of an example of a method for manufacturing an integrated circuit device according to some embodiments of the present disclosure.

FIG. 16 through FIG. 25 illustrates a method for manufacturing an integrated circuit device 1e according to some embodiments of the present disclosure. The stage illustrated in FIG. 16 is the same as, or similar to, the stage illustrated in FIG. 1, except for an amount of the optical coupler 15 and an amount of the photodetector 16. In some embodiments, as shown in FIG. 16, the photonic structure 10e can include at least two optical couplers (including, for example, a first optical coupler 156 and a second optical coupler 157) and at least two photodetectors (including, for example, a first photodetector 161 and a second photodetector 162). The at least two optical couplers (e.g., the first optical coupler 156 and the second optical coupler 157) are disposed side by side and spaced apart from each other. The first optical coupler 156 and the second optical coupler 157 of FIG. 16 can be the same as the optical coupler 15 of FIG. 1. That is, the first optical coupler 156 can have a top surface 1561, a bottom surface 1562 opposite to the top surface 1561 and a coupling surface 1563 (or an edge) extending between the top surface 1561 and the bottom surface 1562. The second optical coupler 157 can have a top surface 1571, a bottom surface 1572 opposite to the top surface 1571 and a coupling surface 1573 (or an edge) extending between the top surface 1571 and the bottom surface 1572. The first photodetector 161 and the second photodetector 162 of FIG. 16 can be the same as the photodetector 16 of FIG. 1. In addition, a configuration between the first optical coupler 156 and the first photodetector 161 and a configuration between the second optical coupler 157 and the second photodetector 162 can be the same as the configuration between the optical coupler 15 and the photodetector 16 of FIG. 1.

Figure 17:
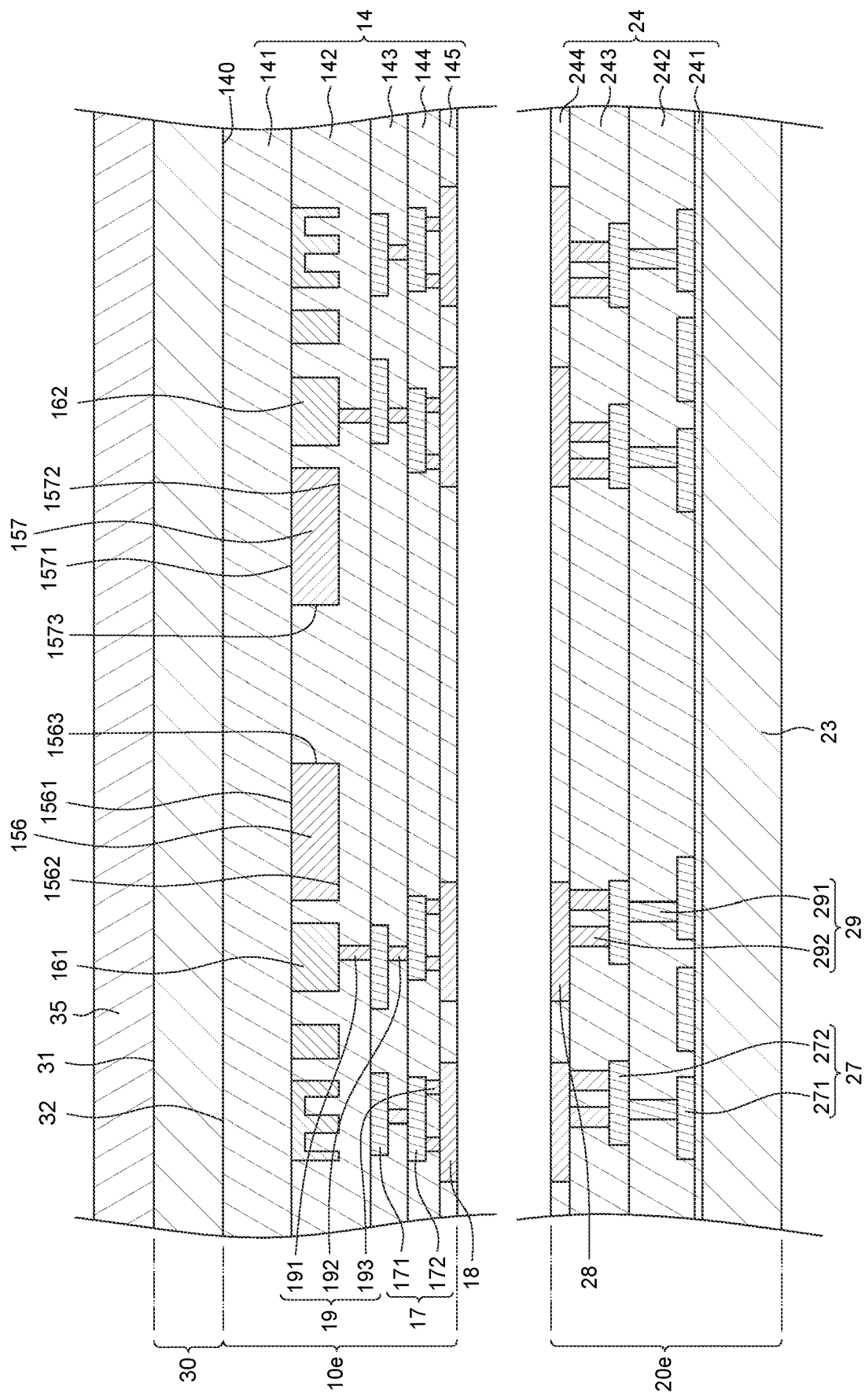
FIG. 17 illustrates a cross-sectional view of one or more stages of an example of a method for manufacturing an integrated circuit device according to some embodiments of the present disclosure.
Figure 18:
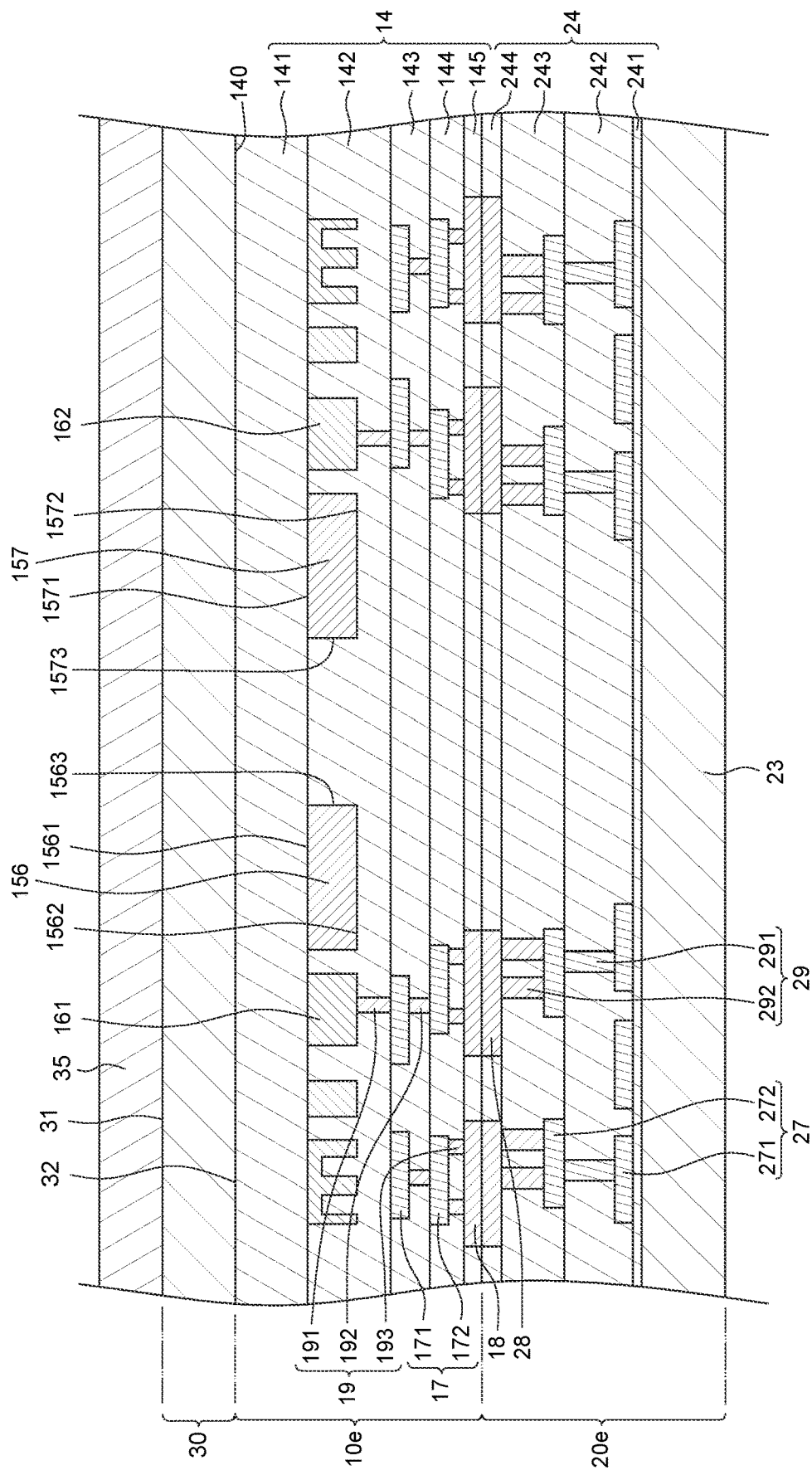
FIG. 18 illustrates a cross-sectional view of one or more stages of an example of a method for manufacturing an integrated circuit device according to some embodiments of the present disclosure.
Figure 19:
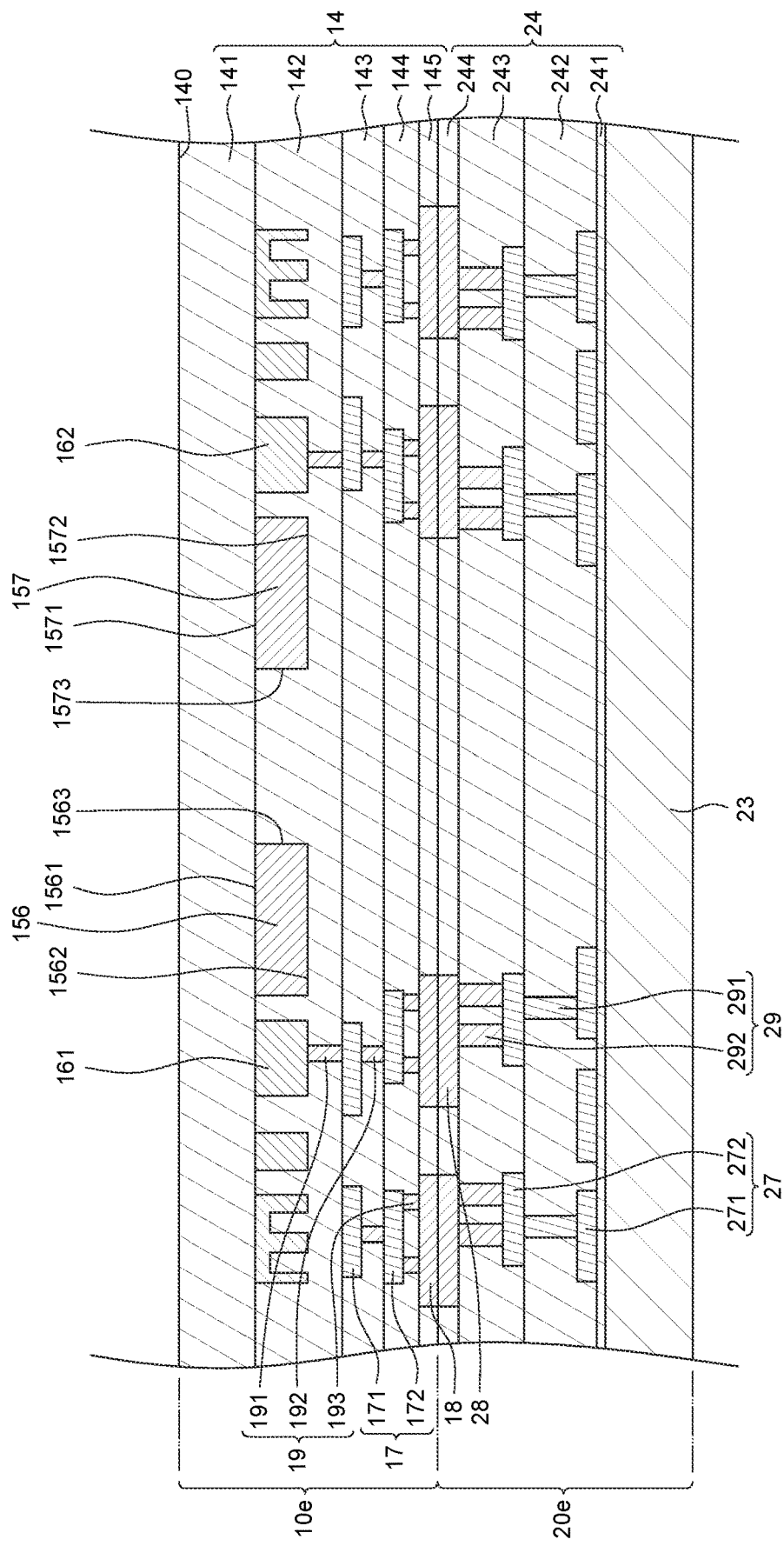
FIG. 19 illustrates a cross-sectional view of one or more stages of an example of a method for manufacturing an integrated circuit device according to some embodiments of the present disclosure.

The stages illustrated in FIG. 17 through FIG. 19 are the same as, or similar to, the stages illustrated in FIG. 2 through FIG. 4. In addition, the electronic structure 20e of FIG. 17 can be the same as the electronic structure 20 of FIG. 2.

Figure 20:
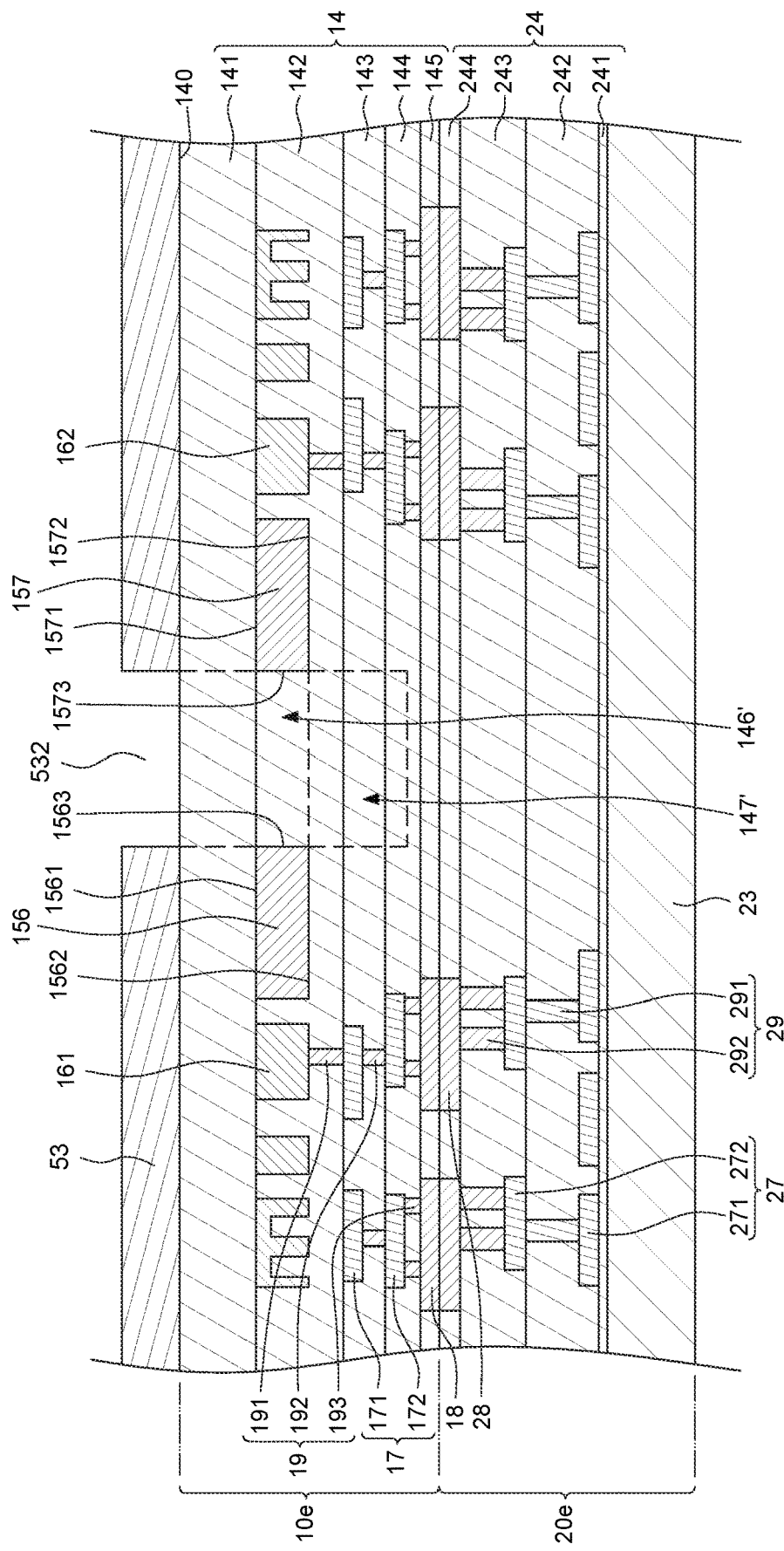
FIG. 20 illustrates a cross-sectional view of one or more stages of an example of a method for manufacturing an integrated circuit device according to some embodiments of the present disclosure.

Referring to FIG. 20, a first photoresist layer 53 is formed on a top surface 140 (e.g., a top surface of the first insulating layer 141) of the insulating structure 14 to cover a portion of the top surface 140 by, for example, coating. In some embodiments, as shown in FIG. 20, the insulating structure 14 can define a first portion 146' and a second portion 147' below the first portion 146'. The first photoresist layer 53 can define an opening 532 extending through the first photoresist layer 53. The opening 532 can expose the first portion 146' of the insulating structure 14.

Figure 21:
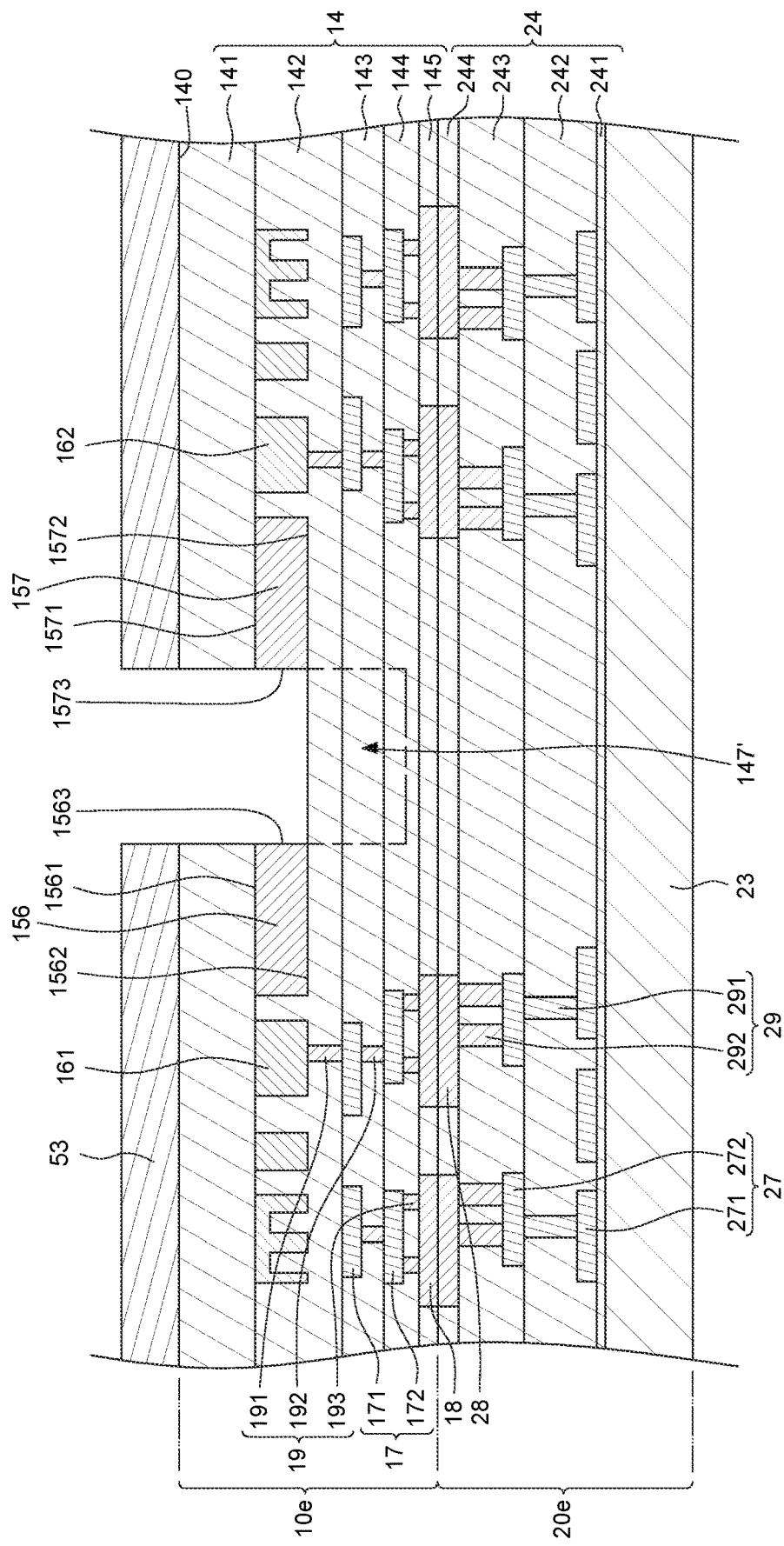
FIG. 21 illustrates a cross-sectional view of one or more stages of an example of a method for manufacturing an integrated circuit device according to some embodiments of the present disclosure.

Referring to FIG. 21, the first portion 146' of the insulating structure 14 is removed to expose the coupling surface 1563 (or the edge) of the first optical coupler 156, the coupling surface 1573 (or the edge) of the second optical coupler 157 and the second portion 147' of the insulating structure 14 by, for example, etching. In some embodiments, the first optical coupler 156 and the second optical coupler 157 can also be referred to as "edge coupler."

Figure 22:
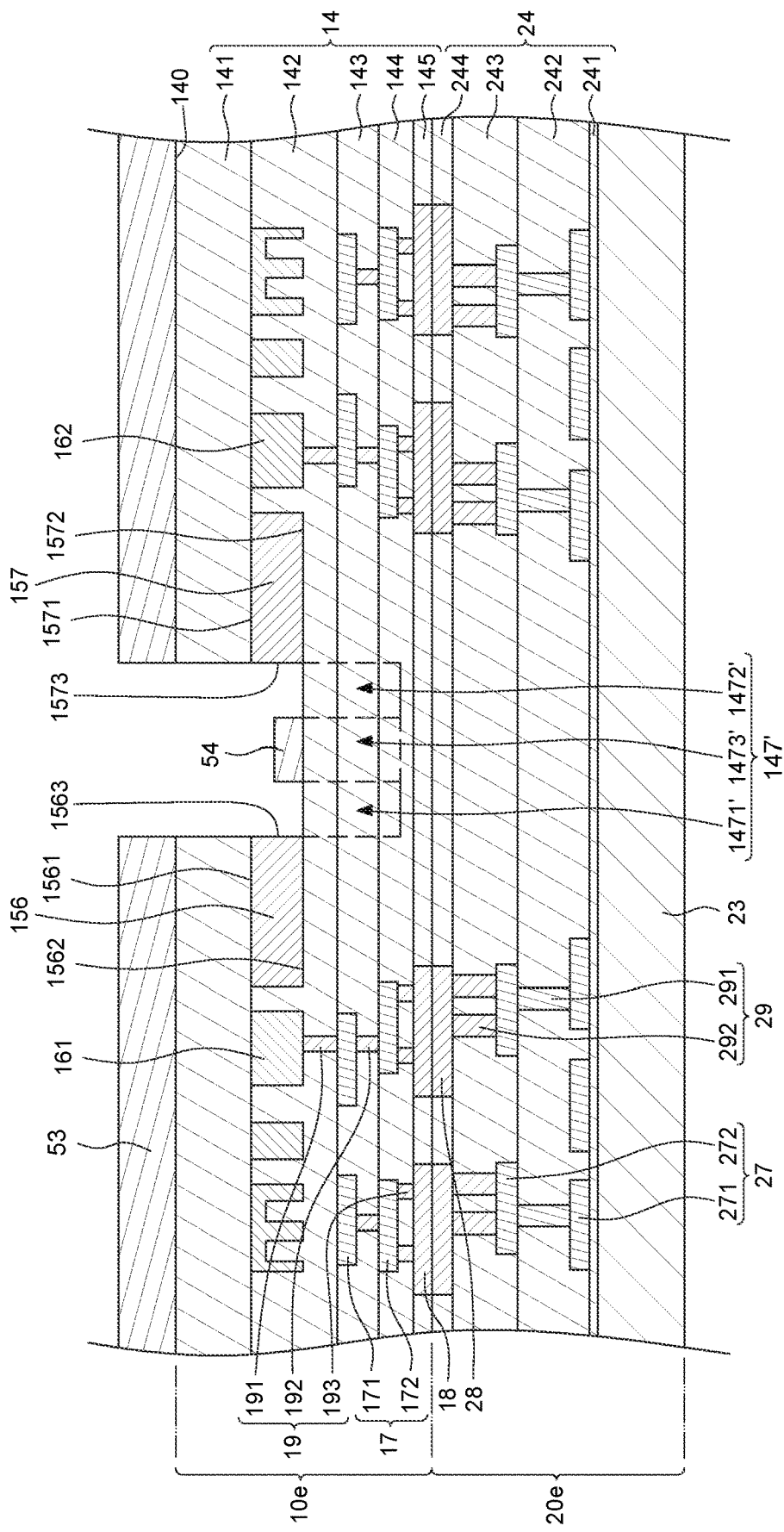
FIG. 22 illustrates a cross-sectional view of one or more stages of an example of a method for manufacturing an integrated circuit device according to some embodiments of the present disclosure.

Referring to FIG. 22, a second photoresist layer 54 is formed on a top surface of the second portion 147' of the insulating structure 14 to cover a portion of the top surface of the second portion 147' by, for example, coating. In some embodiments, as shown in FIG. 22, the second portion 147' can define an inner portion 1471', an outer portion 1472' opposite to the inner portion 1471' and an intermediate portion 1473' between the inner portion 1471' and the outer portion 1472'. The second photoresist layer 54 can cover the intermediate portion 1473' and expose the inner portion 1471' and the outer portion 1472'.

Figure 23:
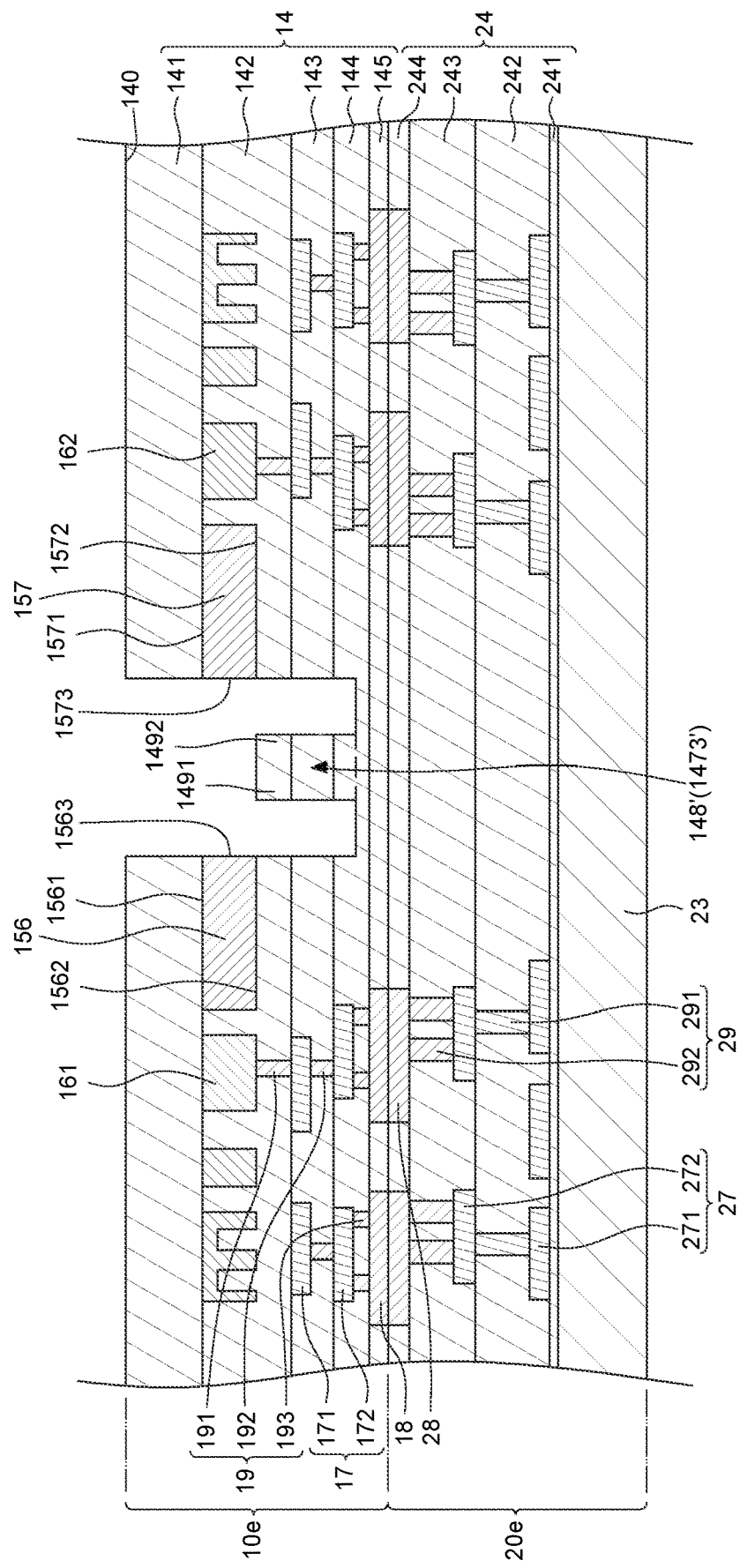
FIG. 23 illustrates a cross-sectional view of one or more stages of an example of a method for manufacturing an integrated circuit device according to some embodiments of the present disclosure.

Referring to FIG. 23, the inner portion 1471' and the outer portion 1472' of the second portion 147' are removed to form a rib portion 148' (i.e., the intermediate portion 1473') on the insulating structure 14 and between the at least two optical couplers (including, for example, the first optical coupler 156 and the second optical coupler 157) by, for example, etching. Then, the first photoresist layer 53 and the second photoresist layer 54 are removed. As shown in FIG. 23, the rib portion 148' has a first corner portion 1491 and a second corner portion 1492 opposite to the first corner portion 1491.

Figure 24:
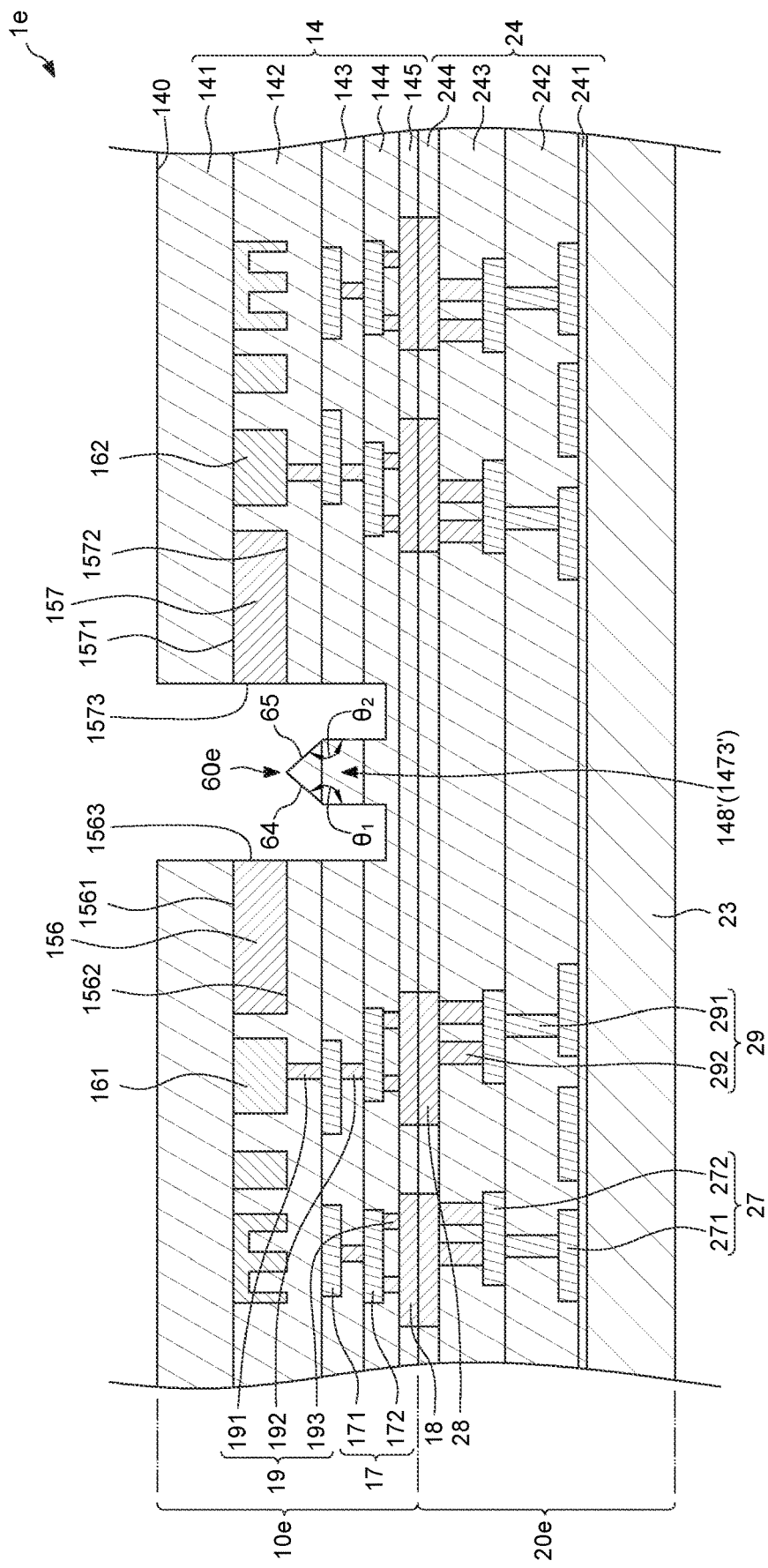
FIG. 24 illustrates a cross-sectional view of one or more stages of an example of a method for manufacturing an integrated circuit device according to some embodiments of the present disclosure.

Referring to FIG. 24, the rib portion 148' is shaped to form a light reflective structure 60e between the at least two optical couplers (e.g., between the first optical coupler 156 and the second optical coupler 157) by, for example, plasma hitting. The light reflective structure 60e corresponds to the coupling surface 1563 of the first optical coupler 156 and the coupling surface 1573 of the second optical coupler 157. In some embodiments, the light reflective structure 60e can include a first inclined reflective surface 64 corresponding to the coupling surface 1563 of the first optical coupler 156 and a second inclined reflective surface 65 corresponding to the coupling surface 1573 of the second optical coupler 157. That is, an inclined direction of the first inclined reflective surface 64 is opposite to an inclined direction of the second inclined reflective surface 65. The plasma can hit the first corner portion 1491 of the rib portion 148' to form the first inclined reflective surface 64 and hit the second corner portion 1492 of the rib portion 148' to form the second inclined reflective surface 65. In some embodiments, an angle $\theta_1$ between the first inclined reflective surface 64 and a lateral surface 1483' of the rib portion 148' can be greater than 90 degrees. An angle $\theta_2$ between the second inclined reflective surface 65 and the lateral surface 1483' of the rib portion 148' can be greater than 90 degrees. In some embodiments, the angle $\theta_1$ can be different from the angle $\theta_2$. The first inclined reflective surface 64 and the second inclined reflective surface 65 can be a mirror-like surface. In some embodiments, as shown in FIG. 24, the first inclined reflective surface 64 can be lower than the top surface 1561 of the first optical coupler 156. The second inclined reflective surface 65 can be lower than the top surface 1571 of the second optical coupler 157.

As shown in FIG. 24, the photonic structure 10e, the electronic structure 20e and the light reflective structure 60e (including, for example, the first inclined reflective surface 64 and the second inclined reflective surface 65) can constitute an integrated circuit device 1e.

Figure 25:
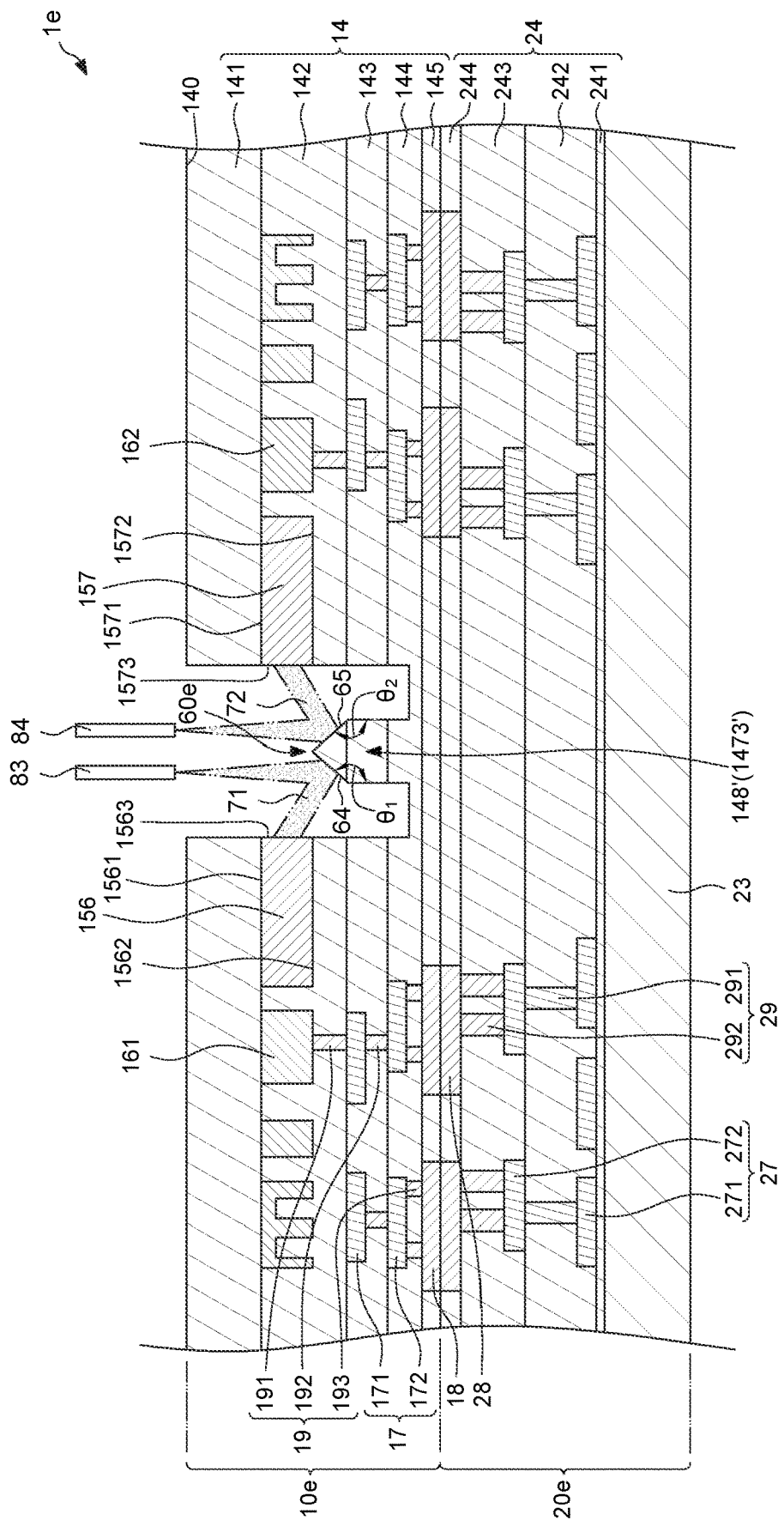
FIG. 25 illustrates a cross-sectional view of one or more stages of an example of a method for manufacturing an integrated circuit device according to some embodiments of the present disclosure.

Referring to FIG. 25, a first light testing signal 71 from a first optical fiber 83 is coupled into the coupling surface 1563 of the first optical coupler 156 through the first inclined reflective surface 64 of the light reflective structure 60e. A second light testing signal 72 from a second optical fiber 84 is coupled into the coupling surface 1573 of the second optical coupler 157 through the second inclined reflective surface 65 of the light reflective structure 60e. Then, the first light testing signal 71 is coupled to the first photodetector 161 from one end of the first optical coupler 156, and the second light testing signal 72 is coupled to the second photodetector 162 from one end of the second optical coupler 157. The first photodetector 161 and the second photodetector 162 can respectively convert the first light testing signal 71 and the second light testing signal 72 into electric testing signals, and output the electric testing signals to the electronic structure 20e to complete the test.

The method of the present disclosure can be applied in an integrated circuit device including the photonic structure 10e as illustrated above; however, the disclosure is not limited thereto. As shown in the embodiments illustrated in FIG. 16 through FIG. 25, the light reflective structure 60e (including, for example, the first inclined reflective surface 64 and the second inclined reflective surface 65) is formed between the at least two optical couplers (including, for example, the first optical coupler 156 and the second optical coupler 157). Optical paths of the first light testing signal 71 and the second light testing signal 72 can be changed from vertical coupling to edge coupling through the light reflective structure 60e (including, for example, the first inclined reflective surface 64 and the second inclined reflective surface 65). Additionally, the first optical coupler 156 and the second optical coupler 157 can be used as edge couplers. The light reflective structure 60e (including, for example, the first inclined reflective surface 64 and the second inclined reflective surface 65) can increase the bandwidth of the edge couplers (i.e., the first optical coupler 156 and the second optical coupler 157) to achieve double-side broadband testing.

Figure 26:
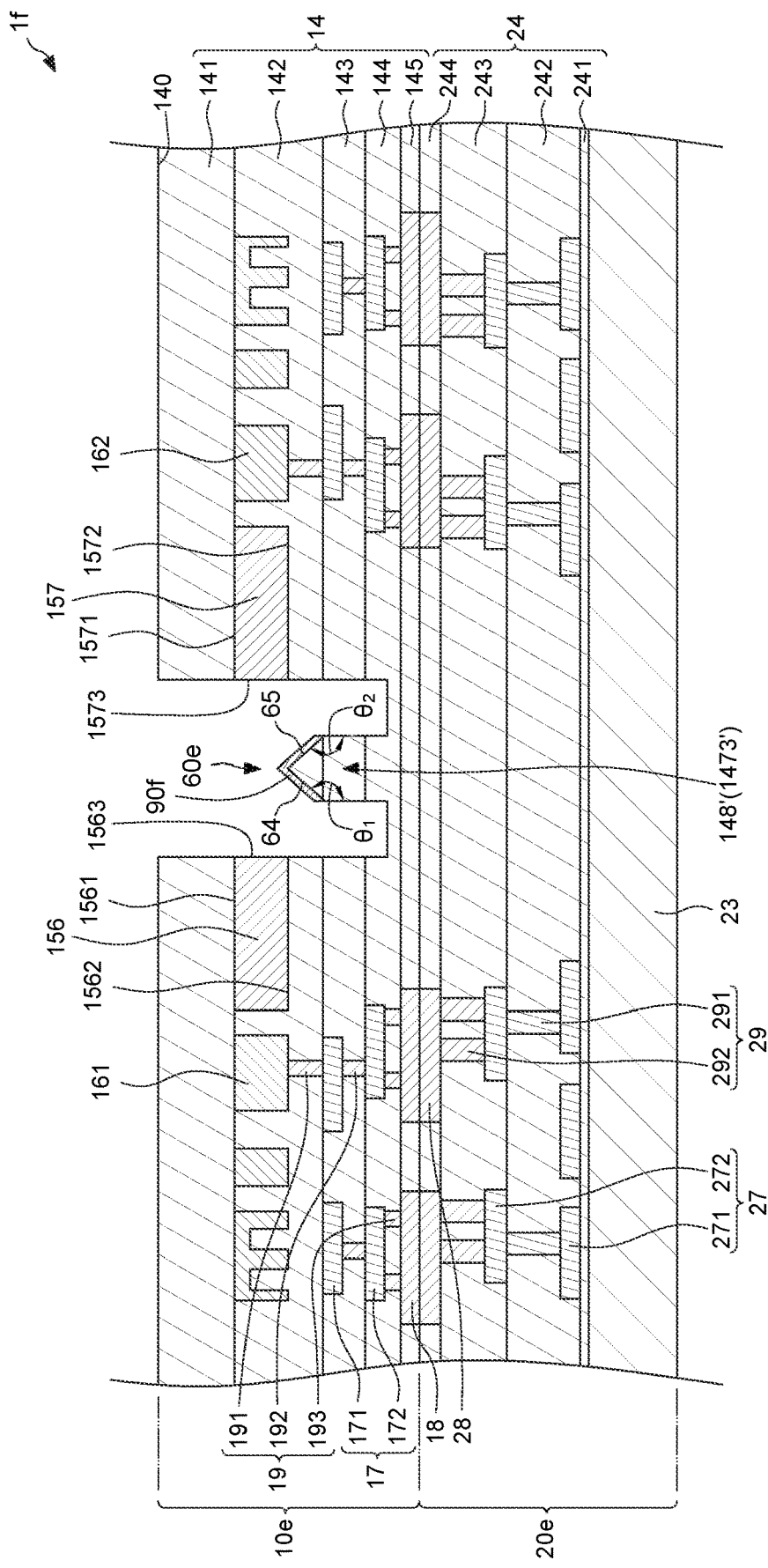
FIG. 26 illustrates a cross-sectional view of one or more stages of an example of a method for manufacturing an integrated circuit device according to some embodiments of the present disclosure.

FIG. 26 illustrates a method for manufacturing an integrated circuit device if according to some embodiments of the present disclosure. The initial stages of the illustrated process are the same as, or similar to, the stages illustrated in FIG. 16 through FIG. 24. FIG. 26 depicts a stage subsequent to that depicted in FIG. 24.

Referring to FIG. 26, a light reflective film 90f is formed or disposed on the first inclined reflective surface 64 and the second inclined reflective surface 65. A material of the light reflective film 90f can include metal, metal oxide, or metal nitride. The metal can be, for example, aluminum (Al), gold (Au), copper (Cu), or tantalum (Ta). The metal oxide can be, for example, titanium dioxide (TiO$_2$). The metal nitride can be, for example, Tantalum nitride (TaN). In some embodiments, the light reflective film 90b can be a distributed Bragg reflector (DBR) film.

In accordance with some embodiments of the present disclosure, a method for manufacturing an integrated circuit device includes: providing a photonic structure including an insulating structure and an optical coupler embedded in the insulating structure; and removing a portion of the insulating structure to expose a coupling surface of the optical coupler and form a light reflective structure corresponding to the coupling surface.

In accordance with some embodiments of the present disclosure, a method for manufacturing an integrated circuit device includes: providing a photonic structure including an insulating structure and at least two optical couplers embedded in the insulating structure and disposed side by side; and removing a portion of the insulating structure to form a light reflective structure between the at least two optical couplers.

In accordance with some embodiments of the present disclosure, an integrated circuit device includes a photonic structure and a light reflective structure. The photonic structure includes an insulating structure and an optical coupler in contact with the insulating structure. The optical coupler has a coupling surface exposed from a lateral surface of the insulating structure. The light reflective structure is disposed on the photonic structure and corresponds to the coupling surface of the optical coupler.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for manufacturing an integrated circuit device, comprising:
   (a) providing a photonic structure including an insulating structure and an optical coupler embedded in the insulating structure; and
   (b) removing a portion of the insulating structure to expose a coupling surface of the optical coupler and form a light reflective structure corresponding to the coupling surface;
   wherein (b) comprises:
      (b1) removing a first portion of the insulating structure to expose the coupling surface of the optical coupler;
      (b2) removing a second portion of the insulating structure to form a rib portion on the insulating structure; and
      (b3) shaping the rib portion to form the light reflective structure.

2. The method of claim 1, wherein the light reflective structure includes an inclined reflective surface, and (b3) comprises:
   (b31) hitting a portion of the rib portion to form the inclined reflective surface by plasma.

3. The method of claim 2, wherein after (b), the method further comprises:
   (c) forming a light reflective film on the inclined reflective surface.

4. The method of claim 3, wherein the light reflective film is a distributed Bragg reflector (DBR) film.

5. The method of claim 2, wherein in (b31), the portion of the rib portion is a corner portion.

6. The method of claim 2, wherein an angle between the inclined reflective surface and a lateral surface of the rib portion is greater than 90 degrees.

7. The method of claim 1, wherein the light reflective structure includes an inclined reflective surface, and the inclined reflective surface is lower than the optical coupler.

8. The method of claim 1, wherein the light reflective structure includes an inclined reflective surface, and the inclined reflective surface is lower than a top surface of the optical coupler.

9. The method of claim 1, wherein (a) includes:
   (a1) forming an upper light reflector in the insulating structure and above the optical coupler.

10. The method of claim 1, wherein (a) includes:
    (a1) forming a lower light reflector in the insulating structure and below the optical coupler.

11. A method for manufacturing an integrated circuit device, comprising:
    (a) providing a photonic structure including an insulating structure and at least two optical couplers embedded in the insulating structure and disposed side by side; and
    (b) removing a portion of the insulating structure to form a light reflective structure between the at least two optical couplers;
    wherein (b) comprises:
       (b1) removing a first portion of the insulating structure to expose coupling surfaces of the optical couplers;
       (b2) removing a second portion of the insulating structure to form a rib portion between the optical couplers; and
       (b3) shaping the rib portion to form the light reflective structure.

12. The method of claim 11, wherein the at least two optical couplers include a first optical coupler and a second optical coupler spaced apart from the first optical coupler, and the light reflective structure includes a first inclined reflective surface corresponding to the first optical coupler and a second inclined reflective surface corresponding to the second optical coupler.

13. The method of claim 12, wherein (b3) comprises:
    (b31) hitting a first portion of the rib portion to form the first inclined reflective surface and hitting a second portion of the rib portion to form the second inclined reflective surface by plasma.

14. The method of claim 13, wherein an inclined direction of the first inclined reflective surface is opposite to an inclined direction of the second inclined reflective surface.

15. The method of claim 13, wherein after (b), the method further comprises:
    (c) forming a light reflective film on the first inclined reflective surface and the second inclined reflective surface.

16. The method of claim 12, wherein the first inclined reflective surface is lower than a top surface of the first optical coupler.

17. A method for manufacturing an integrated circuit device, comprising:
   (a) providing a photonic structure including an insulating structure and an optical coupler embedded in the insulating structure, wherein (a) includes:
      (a1) forming an upper light reflector in the insulating structure and above the optical coupler;
   (b) bonding the photonic structure and an electronic structure together; and
   (c) removing a portion of the insulating structure of the photonic structure to expose a coupling surface of the optical coupler and form a light reflective structure corresponding to the coupling surface.

18. The method of claim 17, wherein the light reflective structure includes an inclined reflective surface.

19. The method of claim 18, further comprising forming a light reflective film on the inclined reflective surface.

20. The method of claim 17, wherein (a) further includes:
   (a2) forming a lower light reflector in the insulating structure and below the optical coupler.

\* \* \* \* \*